(12) United States Patent
Fukuda et al.

(10) Patent No.: US 6,462,395 B1
(45) Date of Patent: Oct. 8, 2002

(54) SEMICONDUCTOR DEVICE AND METHOD OF PRODUCING THE SAME

(75) Inventors: Masatoshi Fukuda, Kawasaki (JP); Toshiya Suzuki, Kawasaki (JP); Tomio Katata, Yokohama (JP); Naofumi Nakamura, Yokohama (JP)

(73) Assignees: Fujitsu Limited, Kawasaki (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/688,230

(22) Filed: Oct. 16, 2000

(30) Foreign Application Priority Data

Oct. 26, 1999 (JP) .............................. 11-304631

(51) Int. Cl.[7] .............................................. H01L 29/00
(52) U.S. Cl. .................... 257/520; 257/501; 257/508; 257/621; 257/758; 257/773
(58) Field of Search ................................. 257/520, 501, 257/508, 621, 758, 773, 774, 775

(56) References Cited

U.S. PATENT DOCUMENTS 5,684,331 A * 11/1997 Jun ........................... 257/758
6,011,311 A * 1/2000 Hsing et al. ................ 257/774
6,153,510 A * 11/2000 Ishibashi .................... 438/622

FOREIGN PATENT DOCUMENTS

JP 05347360 A * 12/1993

* cited by examiner

Primary Examiner—Nathan J. Flynn
Assistant Examiner—Remmon R. Fordé
(74) Attorney, Agent, or Firm—Armstrong, Westerman & Hattori, LLP

(57) ABSTRACT

In a semiconductor device having a multilayer interconnection structure, the contact resistance of a conductive plug that connects a wiring layer and an adjacent upper wiring layer is minimized by providing an enlarged portion at the lower end of the conductive plug.

8 Claims, 28 Drawing Sheets

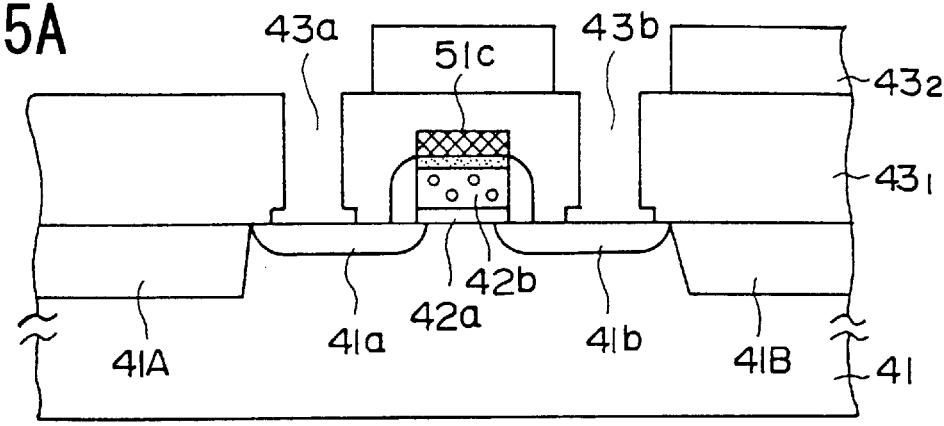
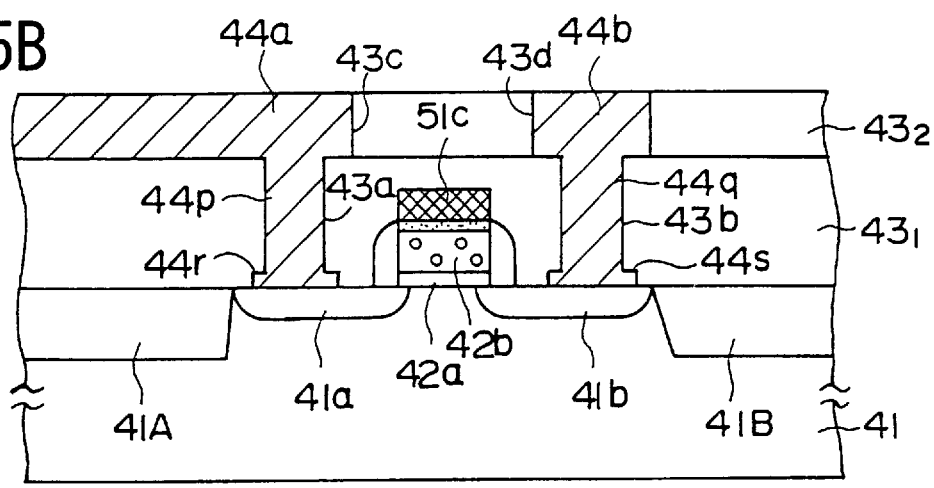
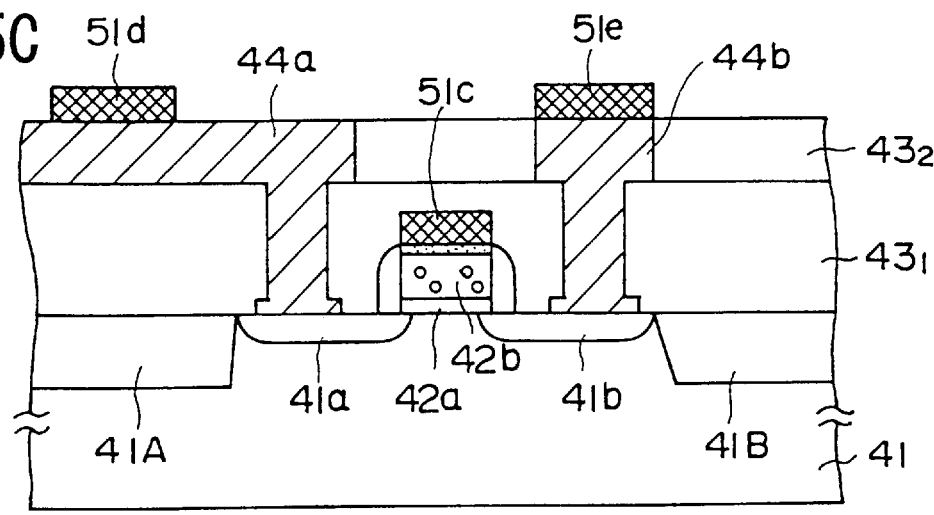

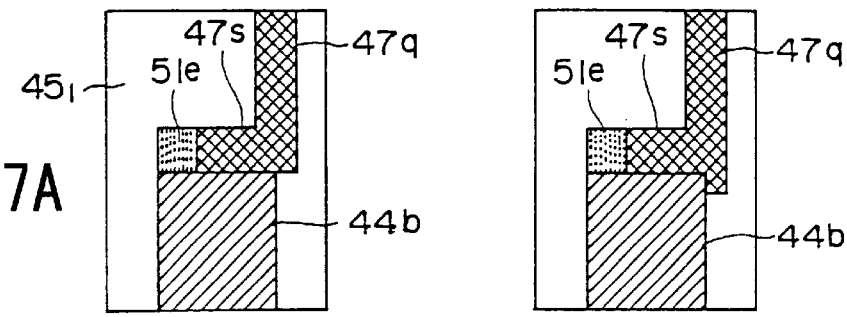
FIG. 17A
FIG. 17D
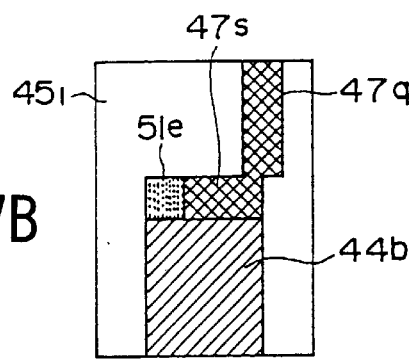
FIG. 17B
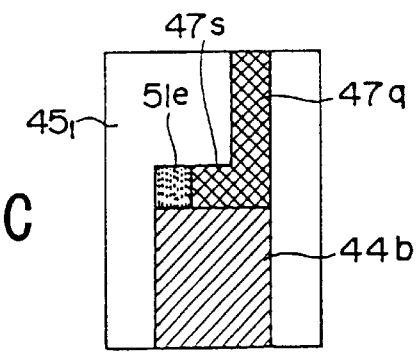
FIG. 17C

SEMICONDUCTOR DEVICE AND METHOD OF PRODUCING THE SAME

BACKGROUND OF THE INVENTION

1. Field of the Invention

The present invention generally relates to semiconductor devices, and, more particularly, to a semiconductor device having a multilayer interconnection structure.

2. Description of the Related Art

The number of active elements in recent ultra-fine semiconductor integrated circuits have greatly increased. To interconnect those numerous active elements, a first wiring layer is covered with an interlayer insulating film, and a second wiring layer is formed on the interlayer insulating film. A conductive plug is then formed in the interlayer insulating film so as to connect the first and second wiring layers. This structure is called a multilayer interconnection structure.

FIG. 1 shows the structure of a conventional semiconductor device 10 having a multilayer interconnection structure.

As shown in FIG. 1, the semiconductor device 10 is formed on a Si substrate 11 provided with isolation areas 11A and 11B. The isolation areas 11A and 11B define an active region on the Si substrate 11, and diffusion areas 11a and 11b acting as source and drain of a MOS transistor are formed in the active region.

On the Si substrate 11, a gate insulating film 12a is formed to cover a channel region formed between the diffusion areas 11a and 11b, and a gate electrode 12b is formed on the gate insulating film 12a. In FIG. 1, sidewall insulating films 12c and 12d are further formed on both side surfaces of the gate electrode 12b. The gate insulating film 12a, the gate electrode 12b, and the sidewall insulating films 12c and 12d constitute a gate structure of the MOS transistor. In the figure, the gate electrode 12b has a polycide structure, having a silicide layer formed on a polysilicon pattern, as indicated by a dotted area in the figure.

On the Si substrate 11, a first interlayer insulating film 13 is formed to cover the gate electrode 12b and the sidewall insulating films 12c and 12d. In the first interlayer insulating film 13, contact holes 13a and 13b are formed to expose the diffusion areas 11a and 11b.

A first-layer wiring pattern 14a to be electrically in contact with the diffusion area 11a through the contact hole 13a is formed on the first interlayer insulting film 13. Another first-layer wiring pattern 14b to be electrically in contact with the diffusion area 11b through the contact hole 13b is also formed on the first interlayer insulating film 13. Here, a conductive plug 14p extends from the wiring pattern 14a through the contact hole 13a, while a conductive plug 14q extends from the wiring pattern 14b through the contact hole 13b. The wiring pattern 14b may be a contact pad to make electric contact with the diffusion area 11b.

On the first interlayer insulating film 13, a second interlayer insulating film 15 is formed to cover the wiring patterns 14a and 14b. In the second interlayer insulating film 15, a contact hole 15a that penetrates through the first interlayer insulating film 13 is formed to expose the gate electrode 12b.

On the second interlayer insulating film 15, a second-layer wiring pattern 16 is formed to make electric contact with the gate electrode 12b through the contact hole 15a. A third interlayer insulating film 17 to cover the wiring pattern 16 is further formed on the second interlayer insulating film 15. Here, a conductive plug 16p extends from the wiring pattern 16 through the contact hole 15a. In the third interlayer insulating film 17, contact holes 17a and 17b are formed to expose the wiring patterns 14a and 14b, respectively. The wiring pattern 16 may be a contact pad to make electric contact with the gate electrode 12b.

On the third interlayer insulating film 17, third-layer wiring patterns 18a and 18b are formed to make contact with the wiring pattern 14a through the contact hole 17a and with the wiring pattern 14b through the contact hole 17b, respectively. On the third interlayer insulating film 17, a fourth interlayer insulating film 19 is further formed to cover the wiring patterns 18a and 18b. Here, a conductive plug 18p extends from the wiring pattern 18a through the contact hole 17a, and a conductive plug 18q extends from the wiring pattern 18b through the contact hole 17b.

In the fourth interlayer insulating film 19, a contact hole 19a is formed to expose the wiring pattern 16. The contact hole 19a is covered with a conductive plug 20 to make electric contact with the wiring pattern 16.

With the above structure, the wiring pattern can be simplified, compared with the wiring pattern formed by a single wiring layer or two wiring layers. Accordingly, signal delay, which is often caused in a large scale semiconductor integrated circuit comprising a semiconductor device having an ultra-fine structure, is reduced. Also, more freedom is allowed in the design of the wiring pattern in such a large scale semiconductor integrated circuit.

In the conventional semiconductor device 10 shown in FIG. 1, however, there is the problem of contact resistance at the connecting portion between a conductive plug and the wiring pattern directly below the conductive plug. For instance, the wiring pattern 14b and the wiring pattern 18b are connected by a conductive plug that fills the contact hole 17b in the interlayer insulating film 17. The diameter of the contact hole 17b is substantially uniform and generally smaller than the width of the wiring pattern 14b, resulting in the contact resistance. The smaller the diameter of a contact hole, the greater the contact resistance. Accordingly, the contact resistance is a very serious problem in today's semiconductor devices having an ultra-fine structure, which is so-called called submicron or sub-quarter-micron.

Furthermore, in the conventional semiconductor device 10 shown in FIG. 1, the diameter of the contact hole 17b is small. If the contact hole 17b deviates from a predetermined location in a photolithographic process, the contact area between the conductive plug and the wiring pattern 14b becomes even smaller, resulting in greater contact resistance. As the contact resistance increases, the time constant of the entire multilayer interconnection structure becomes greater. With the greater time constant, it is difficult to minimize signal delay.

SUMMARY OF THE INVENTION

A general object of the present invention is to provide semiconductor devices and semiconductor device production methods in which the above disadvantages are eliminated.

A more specific object of the present invention is to provide a semiconductor device having a multilayer interconnection structure that reduces contact resistance between wiring layers, and a method of producing such a semiconductor device.

Another specific objects of the present invention is to provide a semiconductor device having a multilayer interconnection structure that prevents an increase of contact resistance even if a contact hole deviates from a predetermined location, and a method of producing such a semiconductor device.

The above objects of the present invention are achieved by a semiconductor device having a multilayer interconnection structure, comprising: a first-layer wiring pattern; an interlayer insulating film formed on the first-layer wiring pattern; a second-layer wiring pattern formed on the interlayer insulating film; and a conductive plug that is formed in the interlayer insulating film and connects the first-layer wiring pattern and the second-layer wiring pattern. The conductive plug comprises: a contact portion that contacts with the first-layer wiring pattern; and a connecting portion that extends from the contact portion toward the second-layer wiring pattern. The contact portion has a larger area than the connecting portion.

The above objects of the present invention are also achieved by a method of producing a semiconductor device that includes a first-layer wiring pattern, an interlayer insulating film formed on the first-layer wiring pattern, a second-layer wiring pattern formed on the interlayer insulating film, and a conductive plug formed in the interlayer insulating film so as to connect the first-layer wiring pattern and the second-layer wiring pattern, said method comprising the steps of:

forming a film on the first-layer wiring pattern, the film having a different etching rate from the interlayer insulating film;

forming the interlayer insulating film on the first-layer wiring pattern so as to cover the film;

forming a contact hole on the interlayer insulating film so as to expose the film;

removing the film by etching through the contact hole; and forming the conductive plug in the contact hole so as to make electric contact with the first-layer wiring pattern.

By the above device or the method, an enlarged portion is formed at the lower end of a conductive plug in a multilayer interconnection structure, so that the contact resistance between the conductive plug and the wiring layer directly below the conductive plug can be minimized. Also, if a contact hole for forming the conductive plug deviates from a predetermined location, the enlarged portion ensures contact with the wiring layer.

The above and other objects and features of the present invention will become more apparent from the following description taken in conjunction with the accompanying drawings.

BRIEF DESCRIPTION OF THE DRAWINGS

FIGS. 5A to 5C illustrate a second part of the production process of the semiconductor device of FIG. 3;

FIGS. 17A to 17D illustrate the advantages of the contact structure in accordance with the second embodiment of the present invention;

DESCRIPTION OF THE PREFERRED EMBODIMENTS

[Principles]

The following is a description of embodiments of the present invention, with reference to the accompanying drawings.

Figure 1:
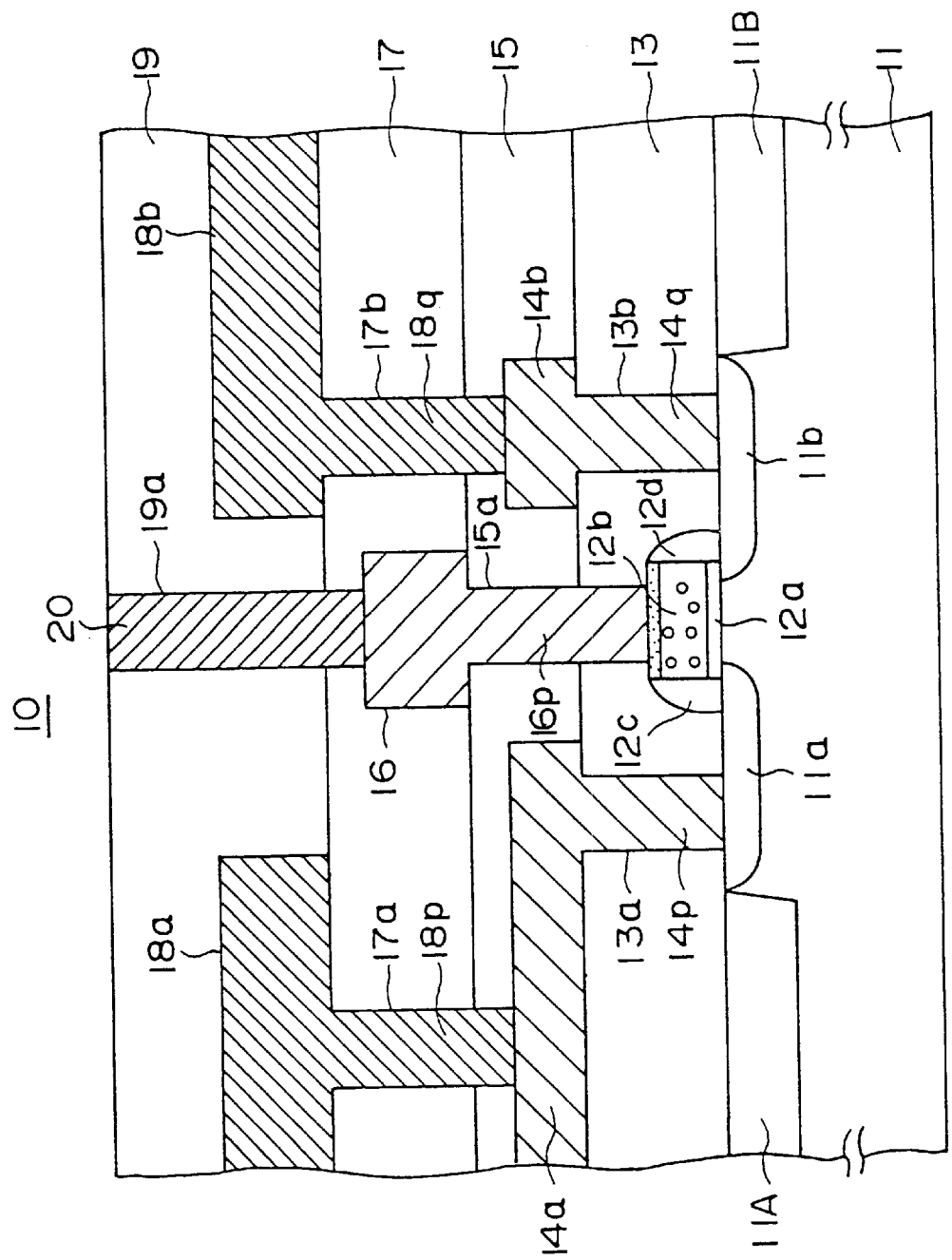
FIG. 1 shows the structure of a conventional semiconductor device having multilayer interconnection structure.
Figure 2:
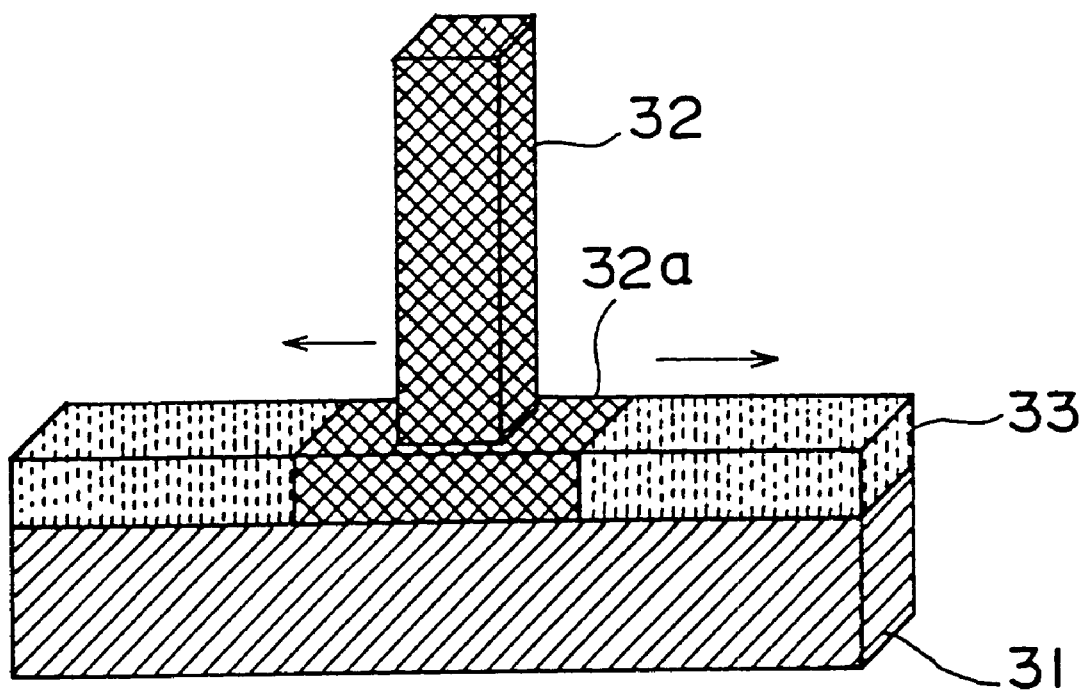
FIG. 2 illustrates the principles of the present invention.

FIG. 2 illustrates the principles of the present invention. In this figure, a wiring pattern 31 is covered with an interlayer insulating film (not shown), and a conductive plug 32 is in contact with the wiring pattern 31 via a contact hole (not shown) formed in the interlayer insulating film. On the wiring pattern 31, an insulating film having different etching resistivity from the interlayer insulating layer is formed. Dry etching or wet etching is selectively performed on the insulating film 33 through the contact hole, so that the contact hole is transversely enlarged in a region corresponding to the insulating film 33 as shown by the arrows in FIG. 2. By forming the conductive plug 32 in the contact hole having the enlarged base portion, the base portion 32a of the conductive plug 32 can also be transversely enlarged. The transversely enlarged base portion 32a contributes to increasing the contact area between the conductive plug 32 and the wiring pattern 31, thereby reducing the contact resistance. It should be understood that a conductive film having different etching resistivity from the interlayer insulating film may be employed instead of the insulating film 33.

[First Embodiment]

Figure 3:
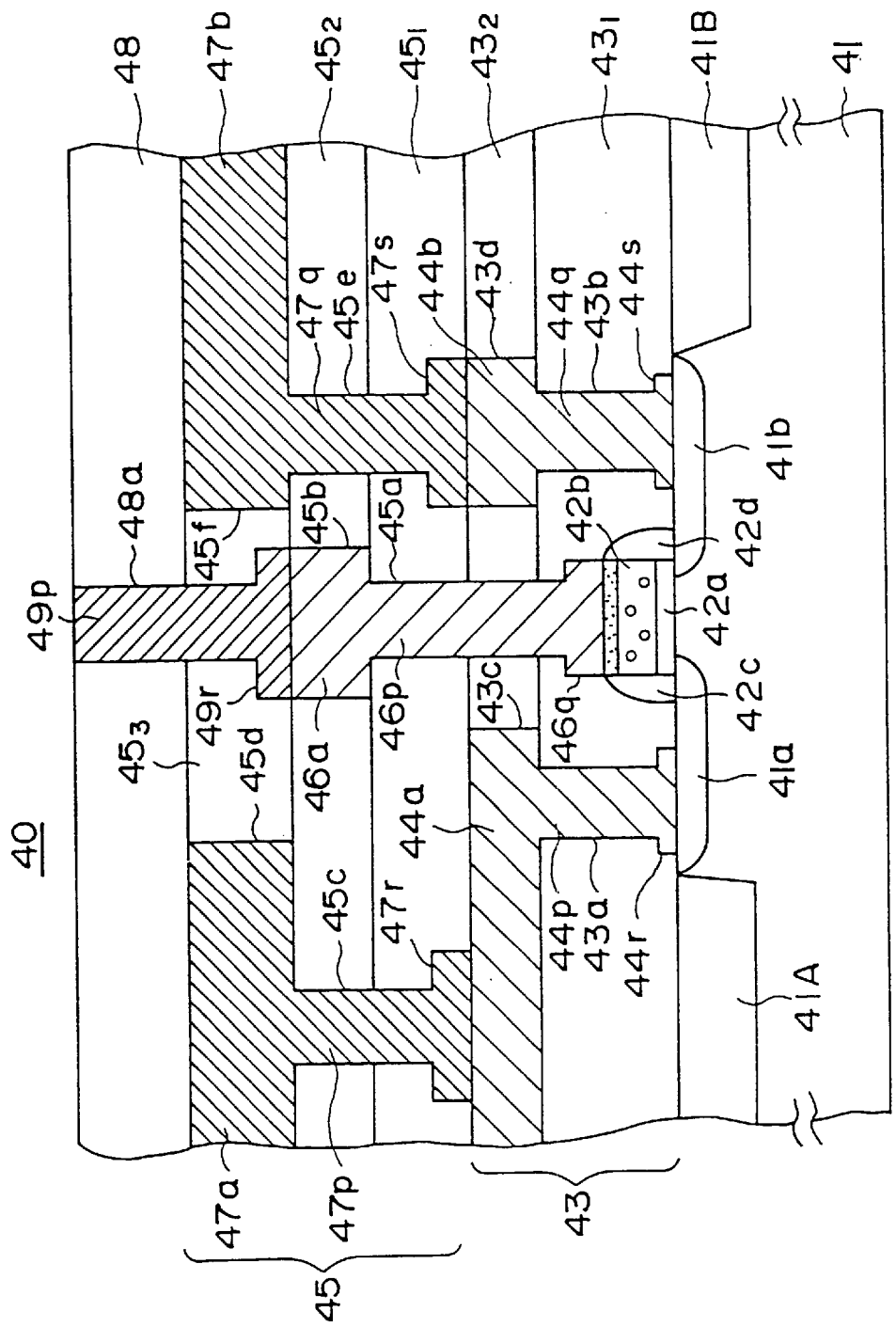
FIG. 3 shows the structure of a semiconductor device in accordance with a first embodiment of the present invention.

FIG. 3 shows the structure of a semiconductor device 40 in accordance with a first embodiment of the present invention.

In FIG. 3, the semiconductor device 40 is formed on a p-type Si substrate 41 having isolation areas 41A and 41B formed thereon. The isolation areas 41A and 41B form an active region on the Si substrate 41. In that active region, diffusion areas 41a and 41b are formed as the source and drain of a MOS transistor.

On the Si substrate 41, a gate insulating film 42a is formed to cover the channel region formed between the diffusion areas 41a and 41b. A gate electrode 42b is formed on the gate insulating film 42a. In this embodiment, sidewall insulating films 42c and 42d are further formed on both side surfaces of the gate electrode 42b. The gate insulating film 42a, the gate electrode 42b, and the sidewall insulating films 42c and 42d constitute the gate structure of the MOS transistor. In this embodiment, the gate electrode 42b has a polycide structure, and is provided with a silicide layer, which is indicated by a dotted area in the figure, on a polysilicon pattern.

On the Si substrate 41, an interlayer insulating film $43_1$ typically made of $SiO_2$ is formed to cover the gate electrode 42b and the sidewall insulating films 42c and 42d. On the interlayer insulating film $43_1$, another interlayer insulating film $43_2$ made of $SiO_2$ is formed, with a thin SiN film (not shown) being interposed therebetween. In the interlayer insulating film $43_1$, contact holes 43a and 43b are formed to expose the diffusion areas 41a and 41b, respectively. In the interlayer insulating film $43_2$, wiring grooves 43c and 43d are formed to expose the contact holes 43a and 43b, respectively. The interlayer insulating films $43_1$ and $43_2$, together with the SiN film between them, constitute a first interlayer insulating film structure 43.

In the wiring groove 43c, a first-layer wiring pattern 44a made of W or the like is formed to make electric contact with the diffusion area 41a through the contact hole 43a. Likewise, in the wiring groove 43d, another first-layer wiring pattern 44b is formed to made electric contact with the diffusion area 41b through the contact hole 43b. In this embodiment shown in FIG. 3, the wiring pattern 44b forms a contact pad in the interlayer insulating film $43_2$. Here, a conductive plug 44p extends from the wiring pattern 44a through the contact hole 43a, while a conductive plug 44q extends from the wring pattern 44b through the contact hole 43b. The wiring pattern 44b may be a contact pad to make electric contact with the diffusion area 41b.

On the interlayer insulating film $43_2$, an interlayer insulating film $45_1$ made of a low dielectric constant inorganic film such as $SiO_2$ or an organic insulating film such as organic SOG (Spin On Glass) is formed to cover the wiring patterns 44a and 44b. On the interlayer insulating film $45_1$, another interlayer insulating film $45_2$ made of a low dielectric constant inorganic film such as $SiO_2$ or an organic insulating film such as organic SOG is formed, with a thin SiN film (not shown) being interposed therebetween. On the interlayer insulating film $45_2$, yet another interlayer insulating film $45_3$ made of a low dielectric constant inorganic film such as $SiO_2$ or an organic insulating film such as organic SOG is formed, with another thin SiN film (not shown) being interposed therebetween.

In the interlayer insulating film $45_1$, a contact hole 45a that penetrates through the interlayer insulating films $43_2$ and $43_1$ is formed to expose the gate electrode 42b. In the interlayer insulating film $45_2$, a wiring groove 45b is formed to expose the contact hole 45a. In the wiring groove 45b, a contact pad 46a made of W or the like is formed, and a W plug 46p extending from the contact pad 46a through the contact hole 45a electrically contacts with the gate electrode 42b.

In the interlayer insulating films $45_2$ and $45_1$, a contact hole 45c is formed to expose the wiring pattern 44a. In the interlayer insulating film $45_3$, a wiring grove 45d is formed to expose the contact hole 45c. In the wiring groove 45d, a Cu wiring pattern 47a is formed, and a Cu plug 47p extending from the Cu wiring pattern 47a electrically contacts with the wiring pattern 44a. The wiring pattern 47a is not limited to Cu, and may be made of Al or W.

In the interlayer insulating films $45_2$ and $45_1$, a contact hole 45e is formed to expose the contact pad 43d. In the interlayer insulating film $45_3$, a wiring groove 45f is formed to expose the contact hole 45e. In the wiring groove 45f, a Cu wiring pattern 47b is formed, and a Cu plug 47q extending from the Cu wiring pattern 47b electrically contacts with the contact pad 44b. The interlayer insulating films $45_1$ to $45_3$ constitute a second interlayer insulating film structure 45.

On the second interlayer insulating film structure 45, an interlayer insulating film 48 made of a low dielectric constant inorganic film such as $SiO_2$ or an organic insulating film such as organic SOG is formed as a third interlayer insulating film structure. In the interlayer insulating film 48, a contact hole 48a is formed to expose the contact pad 46a in the interlayer insulating film $45_2$. A Cu plug 49p is further formed in the contact hole 48a.

In the semiconductor device 40, An enlarged base portion 44r is formed at the lower end or the base of the conductive plug 44p extending from the wiring pattern 44a, and the enlarged base portion 44r contacts with the diffusion area 41a. By forming the enlarged base portion 44r at the lower end of the conductive plug 44p, the contact area of the conductive plug 44p with the diffusion area 41a can be increased, thereby reducing the contact resistance.

In the embodiment shown in FIG. 3, an enlarged base portion having the same structure as the enlarged base portion is provided for each of the conductive plugs 44q, 46p, 47p, 47q, and 49p. More specifically, the conductive plug 44q is formed on an enlarged base portion 44s, the conductive plug 46p on an enlarged base portion 46r, the conductive plug 47p on an enlarged base portion 47r, the conductive plug 47q on an enlarged base portion 47s, and the conductive plug 49p on an enlarged base portion 49r. The contact resistance of each conductive plug is substantially reduced by each of those enlarged base portions.

Next, the steps of producing the semiconductor device 40 shown in FIG. 3 will be described, with reference to FIGS. 4A to 13.

Figure 4A:
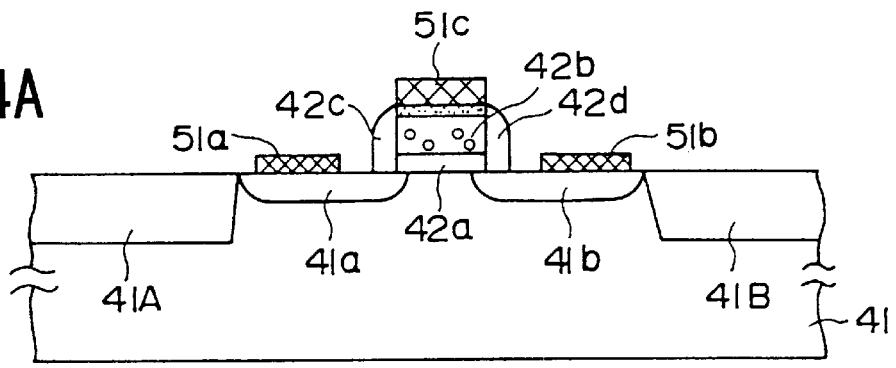
FIGS. 4A to 4C illustrate a first part of the production process of the semiconductor device of FIG. 3.

Referring to FIG. 4A, a gate electrode structure that comprises the gate insulating film 42a, the polycide gate electrode 42b, and the sidewall insulating films 42c and 42d is formed on the Si substrate 41 having the isolation areas 41A and 41B, and the diffusion areas 41a and 41b. Further, SiN patterns 51a and 51b are formed on the diffusion areas 41a and 41b, respectively, and another SiN pattern 51c typically having a thickness of 150 nm and a width of 100 nm is formed on the gate electrode 42b.

Figure 4B:
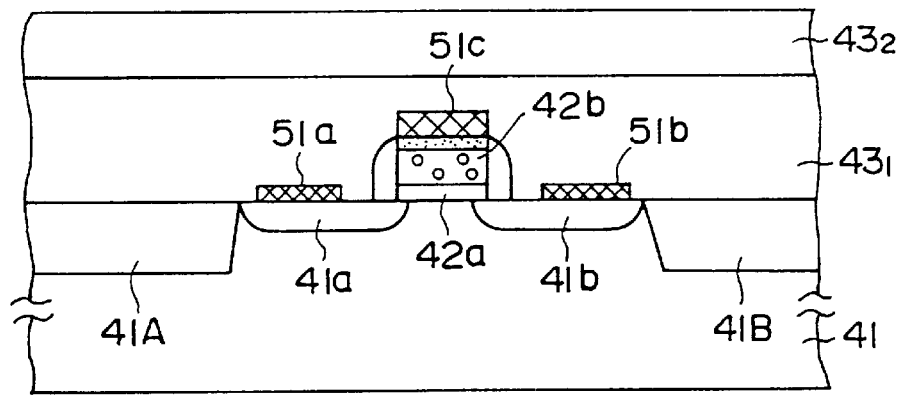

In the next step shown in FIG. 4B, on the Si substrate 41, an $SiO_2$ film is formed as the interlayer insulating film $43_1$, to cover the gate electrode structure and the SiN patterns 51a to 51c. Further, a thin SiN film (not shown) is deposited as an etching stopper film on the interlayer insulating film $43_1$, and anther $SiO_2$ film is the deposited as the interlayer insulating film $43_2$ on the etching stopper film.

Figure 4C:
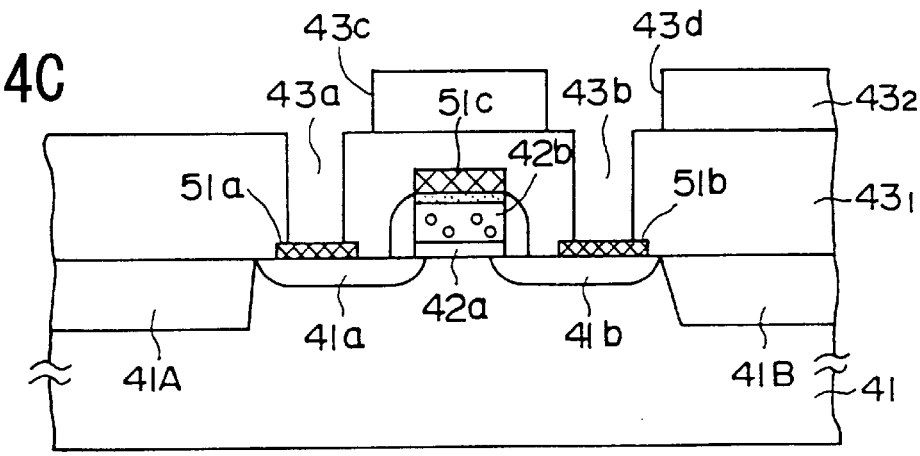

In a step shown in FIG. 4C, the wiring grooves 43c and 43d are formed in the interlayer insulating film $43_2$ by using the SiN film interposed between the interlayer insulating films $43_1$ and $43_2$ as the etching stopper. The contact holes 43a and 43b each having a diameter smaller than the width of each of the SiN patterns 51a and 51b are then formed in the wiring grooves 43c and 43d so as to expose the SiN patterns 51a and 51b.

Referring now to FIG. 5A, the SiN patterns 51a and 51b exposed through the contact holes 43a and 43b are removed by dry etching or wet etching through the contact holes 43a and 43b, with the interlayer insulating film $43_1$ being used as a mask. The removal of the SiN patterns 51a and 51b is carried out selectively with respect to the interlayer insulating films $43_1$ and $43_2$, so that the enlarged base portions corresponding to the SiN patterns 51a and 51b are formed at the lower ends of the contact holes 43a and 43b. In a case where the selective removal of the SiN patterns 51a and 51b is carried out by dry etching, a mixed gas consisting of a fluoride gas, such as $C_4$, $C_4F_8$, or $CH_2F_2$, CO, $O_2$, and Ar, can be used as an etching gas. In a case where the etching is carried out by wet etching, phosphoric acid, hydrofluoric acid, ammonium fluoride, or the like can be used as an etchant.

In a step shown in FIG. 5B, W is deposited by the CVD method with $WF_6$ as a vapor phase material, so that the wiring grooves 43c and 43d are filled. Planarization is then performed to form the wiring pattern 44a and the contact pad 44b. Here, the contact holes 43a and 43b are also filed with W, thereby forming the W plugs 44p and 44q. Since the contact holes 43a and 43b have the enlarged portions, the resultant W plugs 44p and 44q also have the enlarged base portions 44r and 44s, respectively.

In a step shown in FIG. 5C, SiN patterns 51d and 51e each having typically a thickness of 150 nm and a width of 100 nm are formed on the wiring pattern 44a and the contact pad 44b, respectively. In a step shown in FIG. 6A, the interlayer insulating film $45_1$ is deposited on the interlayer insulating film $43_2$ so as to cover the SiN patterns 51d and 51e. The interlayer insulating film $45_2$ is further formed on the interlayer insulating film $45_1$, with a thin SiN film (not shown) being interposed therebetween.

Figure 6A:
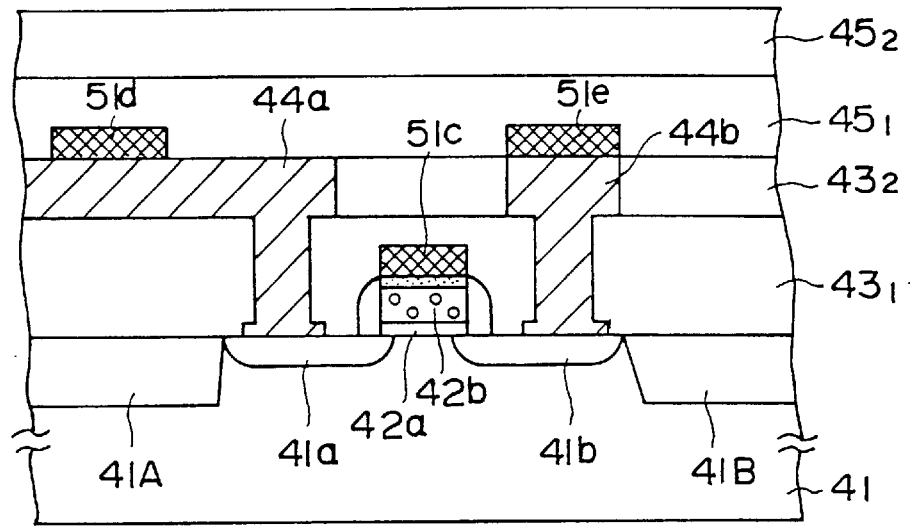
FIGS. 6A and 6B illustrate a third part of the production process of the semiconductor device of FIG. 3.
Figure 6B:
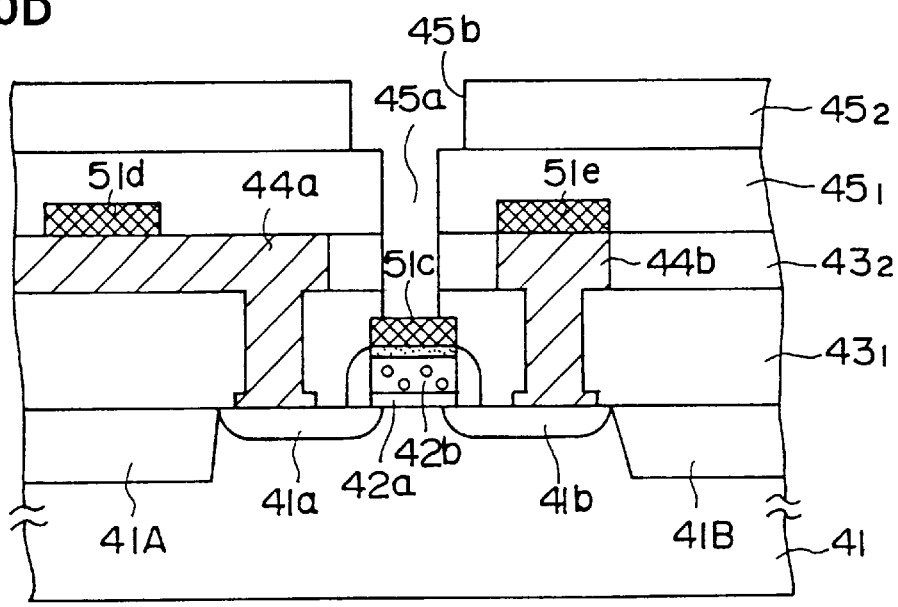

In a step shown in FIG. 6B, the wiring groove 45b is formed in the interlayer insulating film $45_2$ using the SiN film interposed between the interlayer insulating films $45_1$ and $45_2$ as the etching stopper. In the wiring groove 45b, the contact hole 45a having a diameter smaller than the width of the SiN pattern 51c is formed through the interlayer insulating films $45_1$ and $43_2$.

Figure 7A:
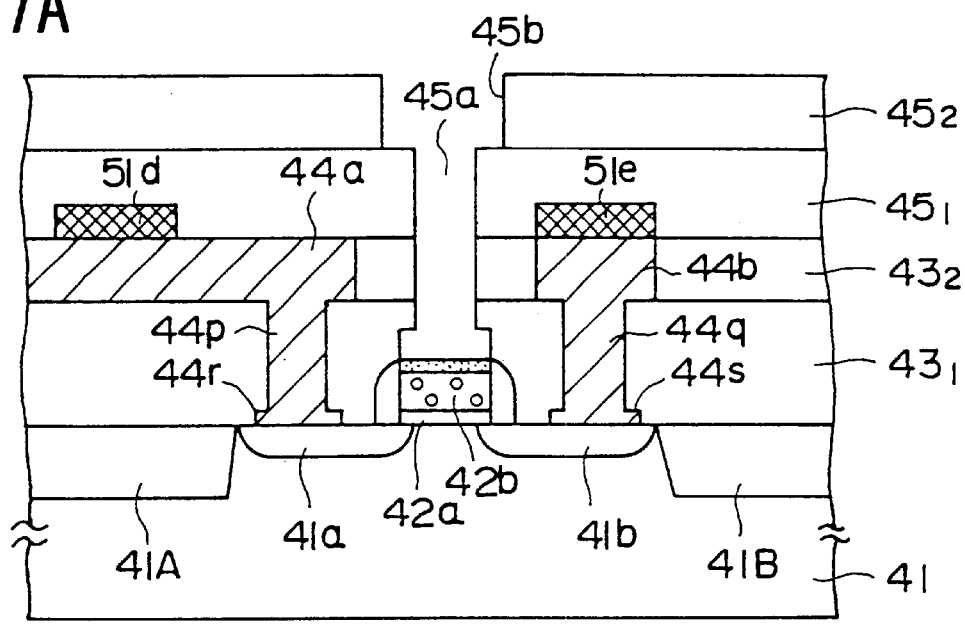
FIGS. 7A and 7B illustrate a fourth part of the production process of the semiconductor device of FIG. 3.

In a step shown in FIG. 7A, the SiN pattern 51c is removed by etching through the contact hole 45a, with the interlayer insulating films $45_1$ and $45_2$ serving as a mask. As a result, an enlarged portion corresponding to the SiN pattern 51c is formed at the lower end of the contact hole 45a. In the case where the selective removal of the SiN pattern 51c is carried out by dry etching, a mixed gas consisting of a fluoride gas such as $CF_4$, $C_4F_8$, or $CH_2F_2$, Co, $O_2$, and Ar can be used as an etching gas. In the case where the selective removal is carried out by wet etching, phosphoric acid, fluoride acid, or ammonium fluoride can be used as an etchant.

Figure 7B:
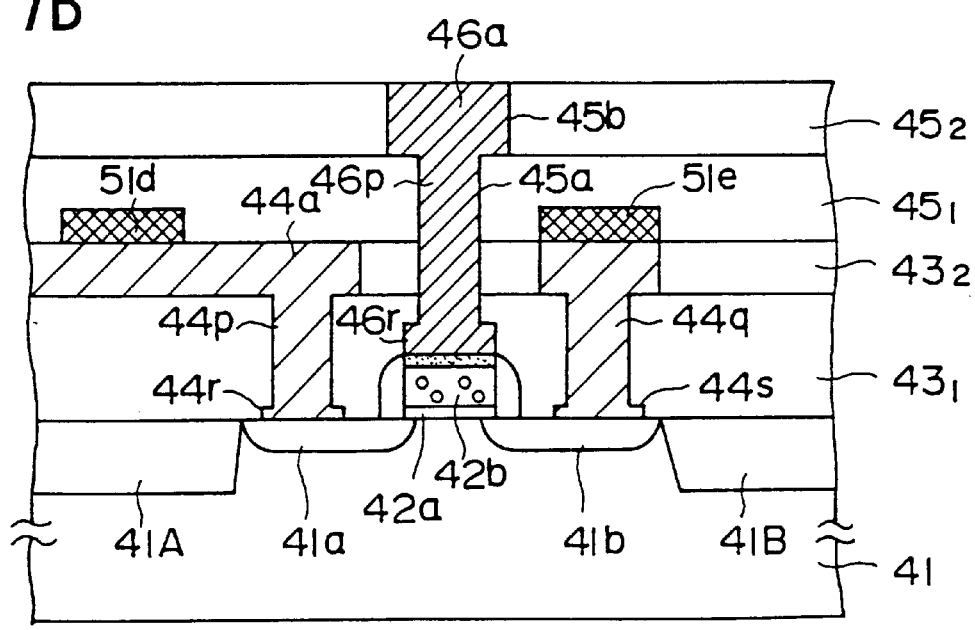

In a step shown in FIG. 7B, the contact hole 45a and the wiring groove 45b are entirely or partially filled with W by the CVD method using $WF_6$ as a vapor phase material, and planarization is then performed by the CMP technique. As a result, the W plug 46p including the contact pad 46p a corresponding to the wiring groove 45b is formed in the contact hole 45a . The W plug 46p has the enlarged base portion 46r corresponding to the SiN pattern 51c . In the case where the contact hole 45a and the wiring groove 45b is partially filled with W, at least the bottom surfaces and the side surfaces of the contact hole 45a and the wiring groove 45b are covered with W film.

Figure 8A:
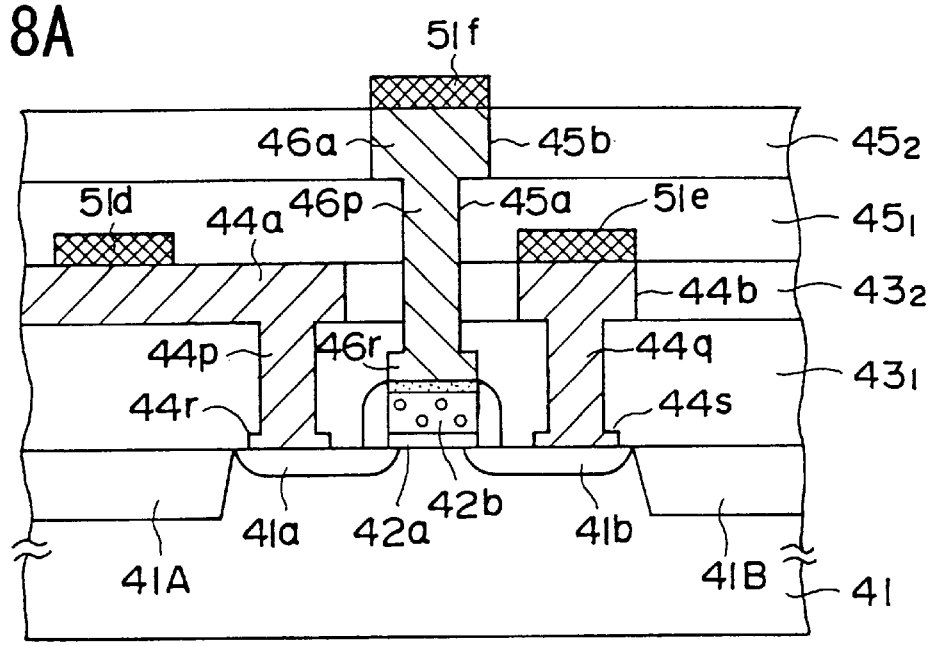
FIGS. 8A and 8B illustrate a fifth part of the production process of the semiconductor device of FIG. 3.
Figure 8B:
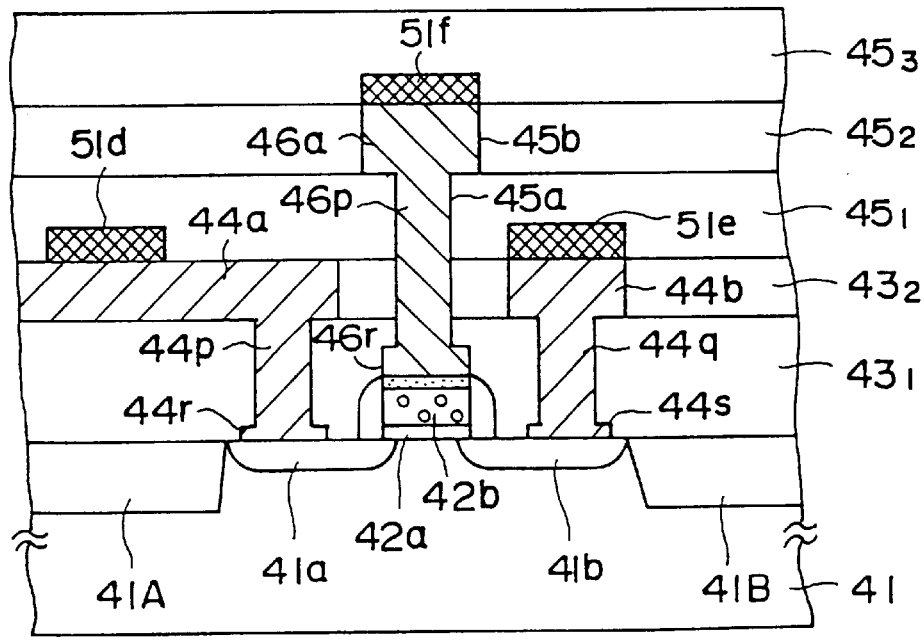

Referring now to FIG. 8A, a SiN pattern 51f typically having a thickness of 150 nm and a 20 width of 100 nm is formed on the contact pad 46a. In a step shown in FIG. 8B, the interlayer insulating film $45_3$ is then deposited on the interlayer insulating film $45_2$, with a thin SiN film being interposed therebetween. Thus, the SiN pattern 51f is covered with the interlayer insulating film $45_3$.

Figure 9A:
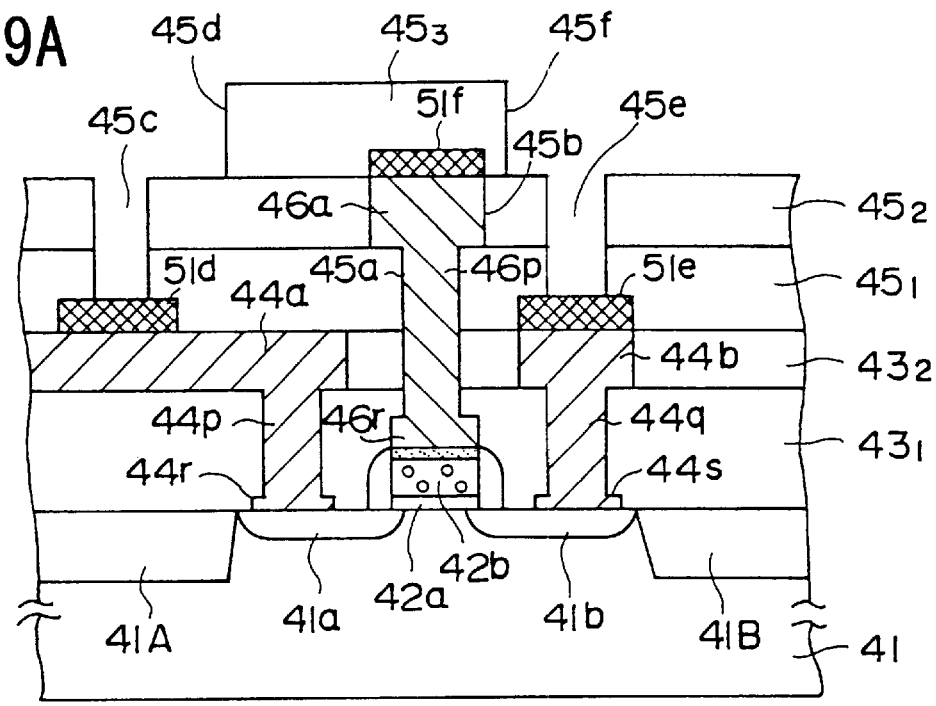
FIGS. 9A and 9B illustrate a sixth part of the production process of the semiconductor device of FIG. 3.

In a step shown in FIG. 9A, the wiring grooves 45d and 45f are formed in the interlayer insulating film $45_3$ using the SiN film between the interlayer insulating films $45_2$ and $45_3$ as an etching stopper. In the wiring grooves 45d and 45f, the contact holes 45c and 45e each having a diameter smaller than each corresponding width of the SiN patterns 51d and 51e are then formed to expose the SiN patterns 51d and 51e.

Figure 9B:
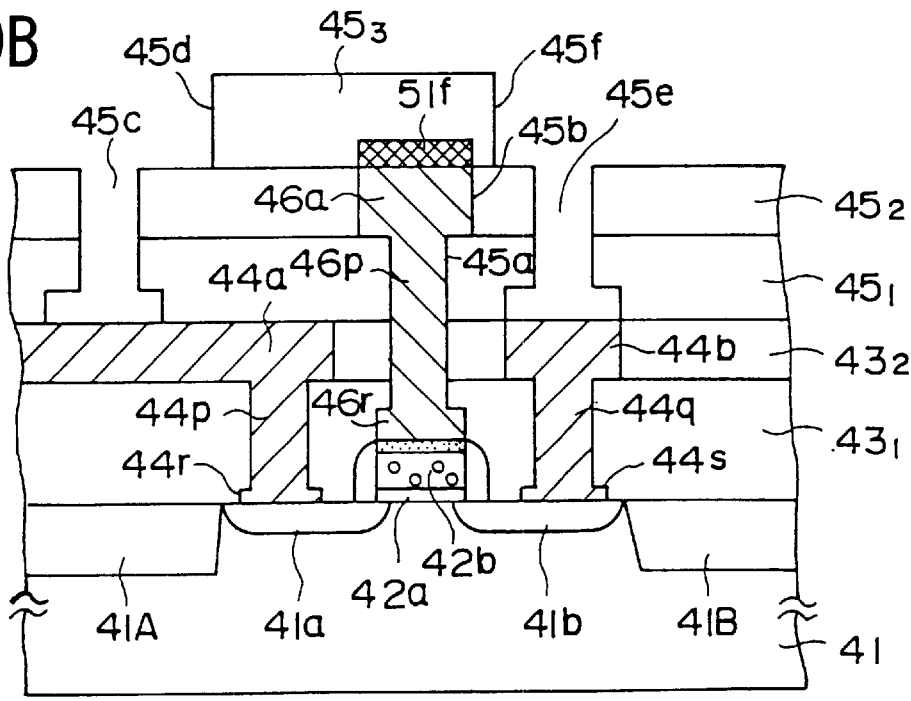

Referring now to FIG. 9B, the SiN patterns 51d and 51e are selectively removed through the contact holes 45c and 45e, with the interlayer insulating films $45_3$ and $45_2$ serving as a mask. As a result, the enlarged portions corresponding to the SiN patterns 51d and 51e are formed at the respective bases of the contact holes 45c and 45e. In the case where the selective removal of the SiN patterns 51d and 51e is carried out by dry etching, a mixed gas consisting of a fluoride gas, such as $CF_4$, $C_4F_8$, or $CH_2F_2$, CO, $O_2$, and Ar, can be used as an etching gas. In the case where the selective removal is carried out by wet etching, phosphoric acid, hydrofluoric acid, or ammonium fluoride can be used as an etchant.

Figure 10:
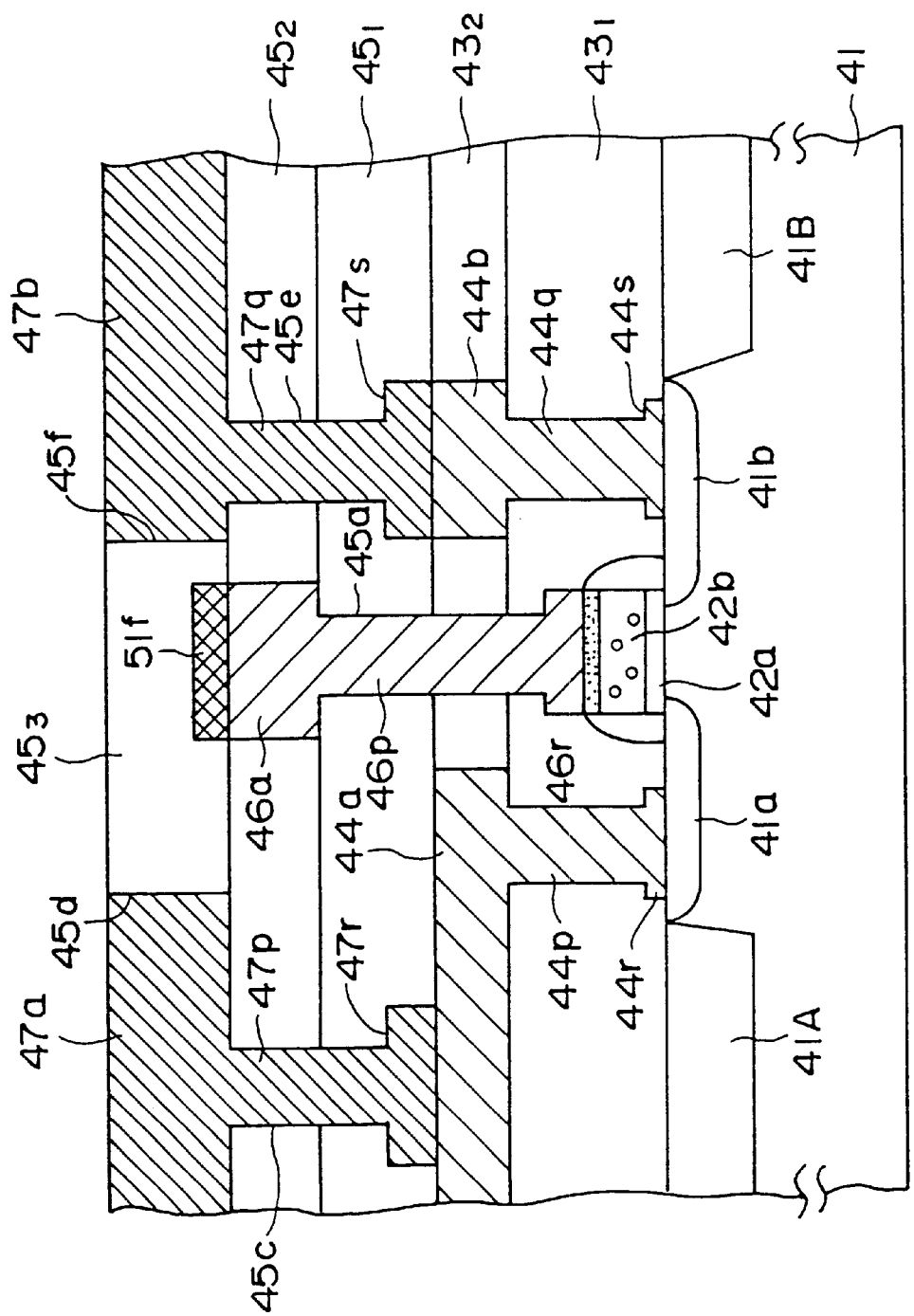
FIG. 10 illustrates a seventh part of the production process of the semiconductor device of FIG. 3.

In the step shown in FIG. 10, the wiring grooves 45d and 45f are filled with Cu by the CVD method using a Cu compound such as Cu(hfa)TMVS (copper hexafluoroacetylacetonate.trimethylvinyl-silane) as a liquid raw material, and planarization is then performed. As a result, the Cu plug 47p containing the Cu wiring pattern 47a corresponding to the contact hole 45d is formed in the contact hole 45c. The Cu plug 47p has the enlarged base portion 47r corresponding to the SiN pattern 51d. Likewise, the Cu wiring pattern 47b is formed in the contact hole 45e. The Cu wiring pattern 47b contains the Cu plug 47q extending into the contact hole 45e. The Cu plug 47q has the enlarged base portion 47s corresponding to the SiN pattern 51e.

Figure 11:
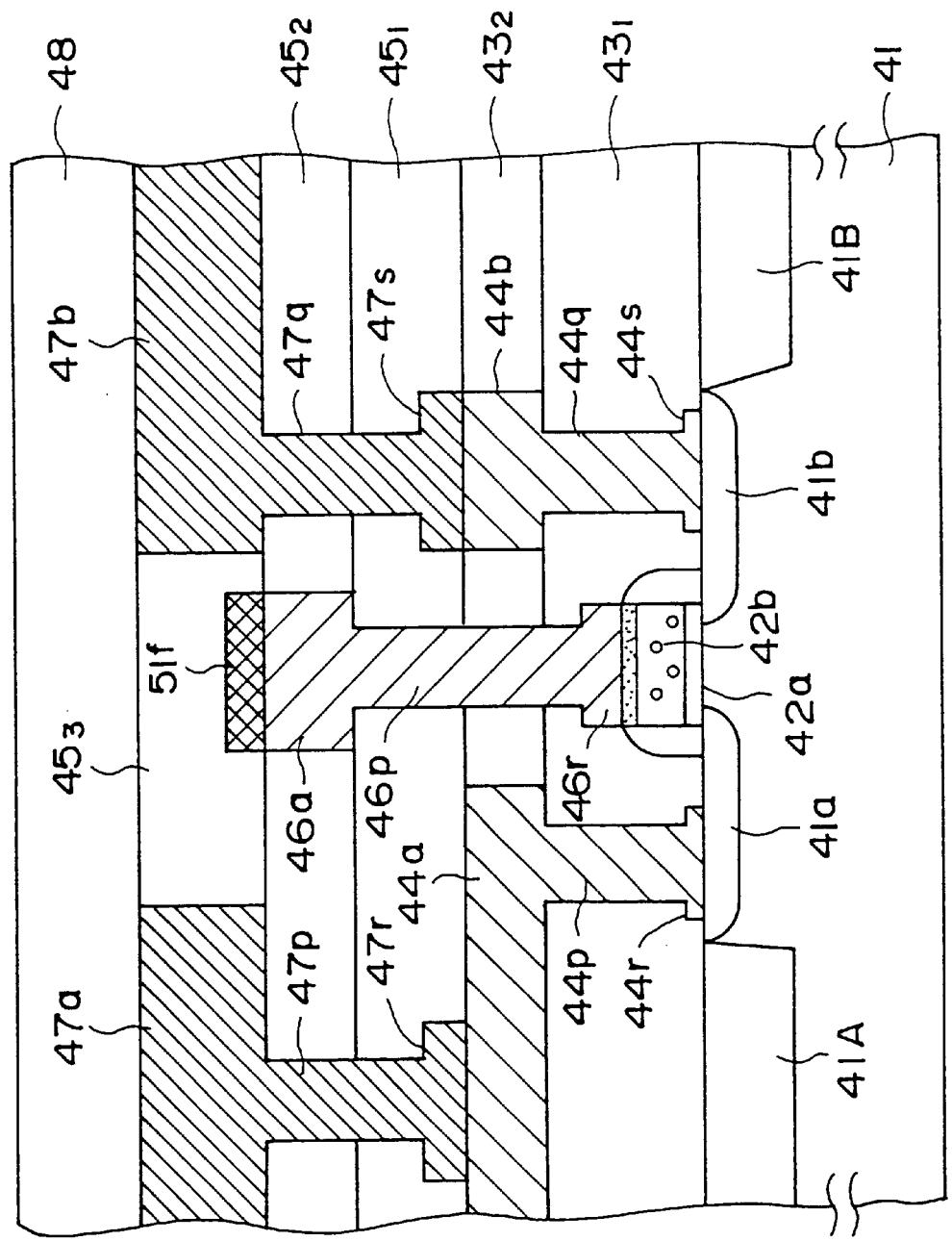
FIG. 11 illustrates an eighth part of the production process of the semiconductor device of FIG. 3.
Figure 12:
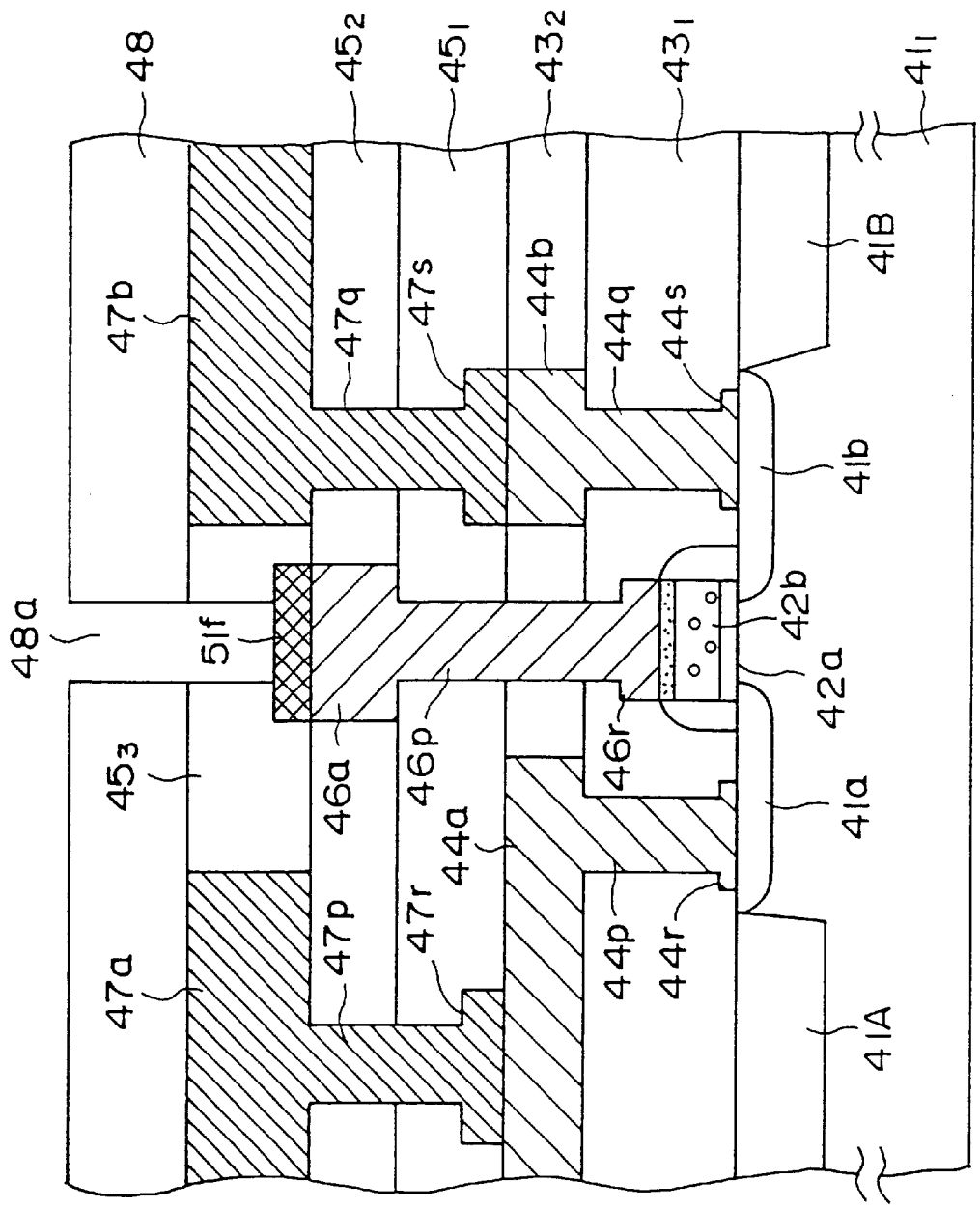
FIG. 12 illustrates a ninth part of the production process of the semiconductor device of FIG. 3.

In a step shown in FIG. 11, the interlayer insulating film 48 is formed on the structure shown in FIG. 10, with a thin SiN film being interposed therebetween. In a step shown in FIG. 12, the contact hole 48a is formed in the interlayer insulating film 48 so as to expose the SiN pattern 51f.

Figure 13:
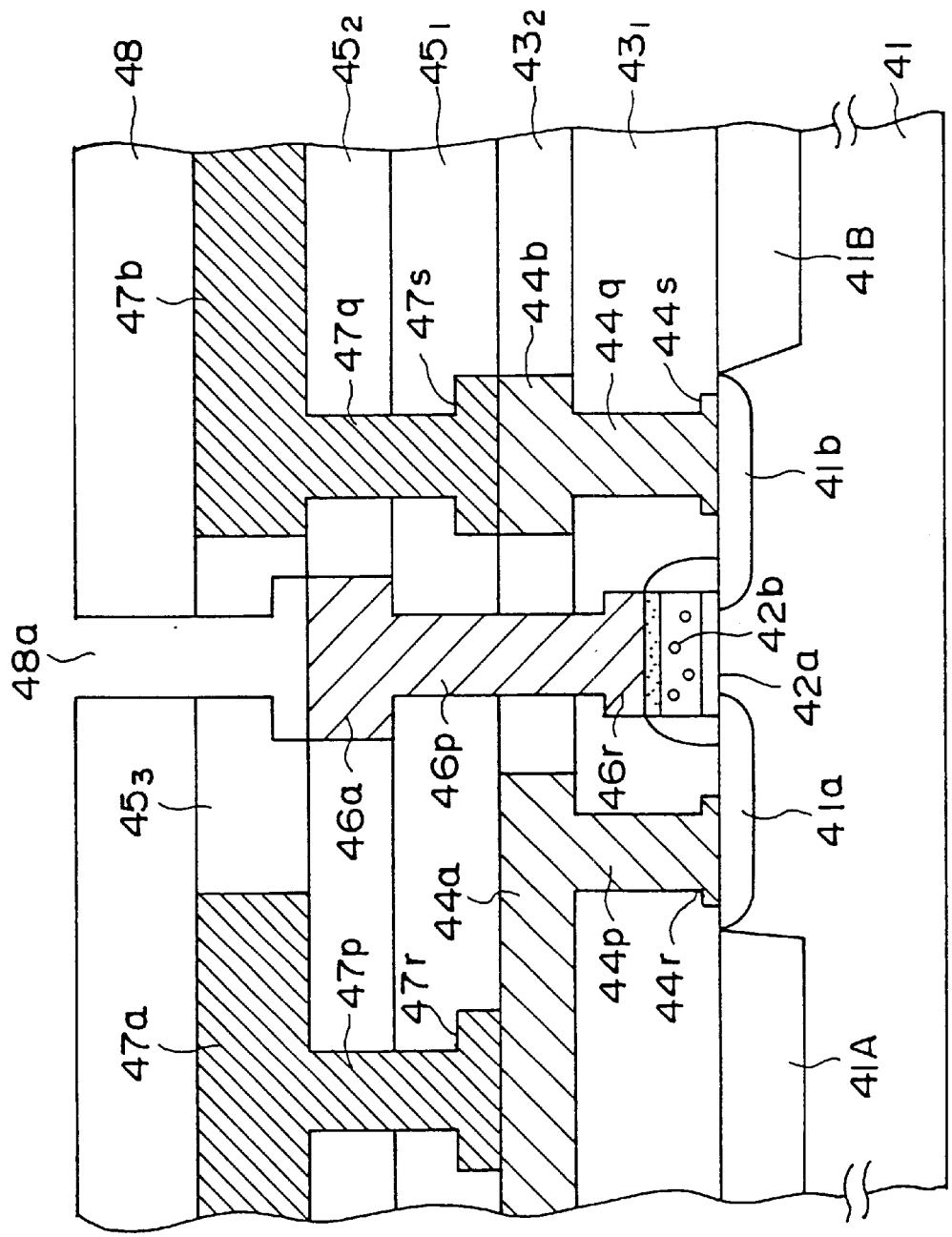
FIG. 13 illustrates a tenth part of the production process of the semiconductor device of FIG. 3.

In a step shown in FIG. 13, the SiN pattern 51f is selectively removed by etching through the contact hole 48a, with the interlayer insulating film 48 serving as a mask. As a result, an enlarged portion corresponding to the SiN pattern is formed at the lower end of the contact hole 48a. In the case where the selective removal of the SiN pattern 51f is carried out by dry etching, a mixed gas consisting of a fluoride gas, such as $CF_4$, $C_4F_8$, or $CH_2F_2$, Co, $O_2$, and Ar, can be used as an etching gas. In the case where the selective removal is carried out by wet etching, phosphoric acid, hydrofluoric acid, or ammonium fluoride can be used as an etchant.

A Cu layer is further deposited on the structure shown in FIG. 13 by the CVD method, so that the contact hole 48a having the enlarged base portion is filled with Cu. Here, the semiconductor device 40 shown in FIG. 3 is completed.

Although SiN patterns are used as the patterns 51a to 51f subjected to the selective etching in this embodiment, any other insulating film or conductive film can be used for the patterns 51a to 51f, as long as it can be selectively removed with respect to the surrounding interlayer insulating films in the etching step for forming the enlarged base portion in each contact hole.

Figure 14A:
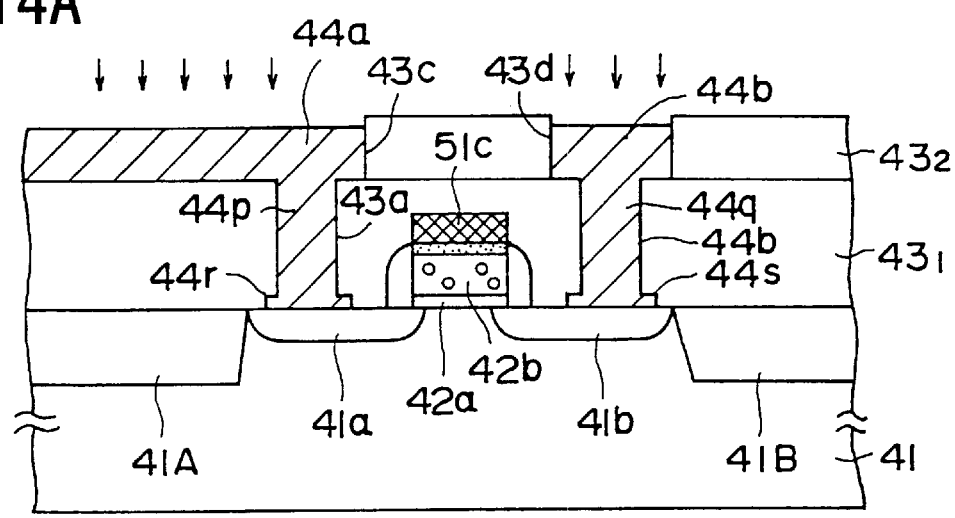
FIGS. 14A and 14B show a modification of the first embodiment of the present invention.
Figure 14B:
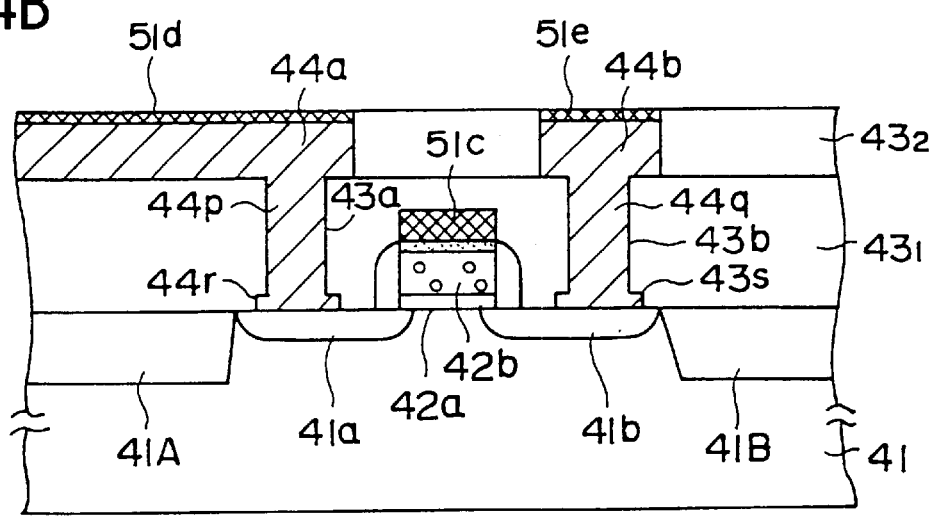

FIGS. 14A and 14B illustrate a modification of the steps shown in FIGS. 5A and 5B of the first embodiment of the present invention.

Referring to FIG. 14A, the wiring pattern 44a and the contact pad 44b are slightly etched, and a SiN film is then formed on the resultant structure. The SiN film is then polished and removed by the CMP method so as to expose the interlayer insulating film $43_2$. As a result, the SiN pattern 51d formed on the surface of the wiring pattern 44a and the SiN pattern 51e is formed on the surface of the contact pad 44b, as shown in FIG. 14B. The resultant structure is then processed in the same step as shown in FIG. 5C, followed by the steps of FIGS. 6A to 13.

[Second Embodiment]

Referring to FIGS. 15A to 16C, a second embodiment of the present invention will be described below by way of the example of the enlarged base portion 47s of the conductive plug 47q.

Figure 15A:
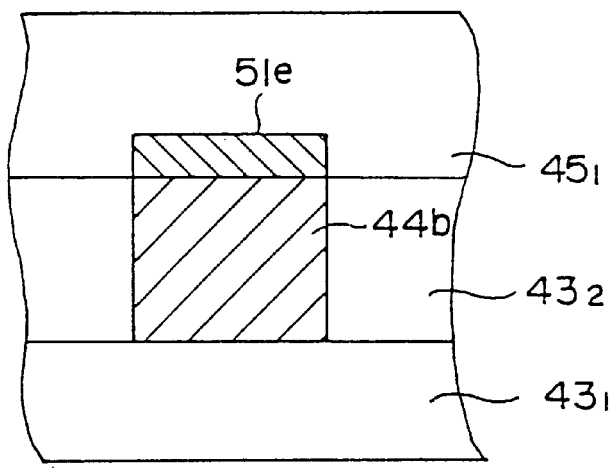
FIGS. 15A to 15C illustrate a first part of the formation process of a contact structure in accordance with a second embodiment of the present invention.

In FIG. 15A, the W contact pad 44b is formed on the interlayer insulating film $43_2$, and the SiN pattern 51e is formed on the contact pad 44b. Also, the contact pad 44b and the SiN pattern 51e are covered with the interlayer insulating film $45_1$. However, it should be noted that, in FIGS. 15A to 16C, the conductive plug 44q extending downward from the contact pad 44b is omitted for simplification. Accordingly, FIG. 15A corresponds to the step shown in FIG. 8B.

Figure 15B:
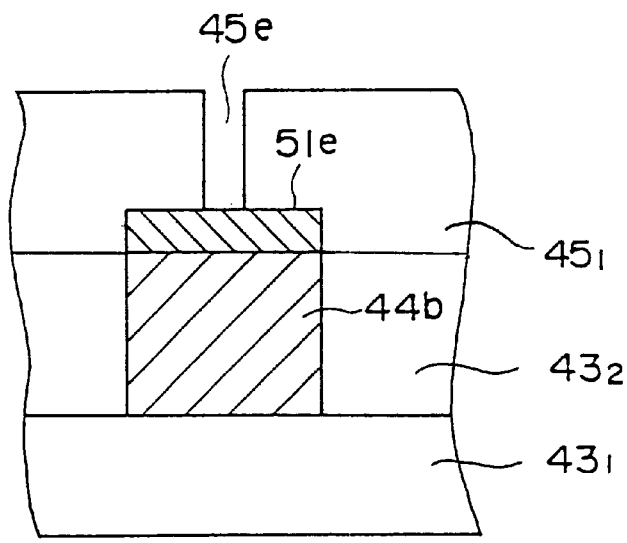

In a step shown in FIG. 15B corresponding to the step shown in FIG. 9A, the contact hole 45e is formed in the interlayer insulating film $45_1$. In a step shown in FIG. 15C, the SiN pattern 51e is removed by etching through the contact hole 45e. Since the interlayer insulating film $45_1$ is made of an inorganic insulating film such as PSG, BPSG, or $SiO_2$, or an organic insulating film such as organic SOG, which has a different etching rate from SiN, only the SiN pattern 51e is selectively etched so as to form the enlarged base portion at the lower end of the contact hole 45e. As described before, the selective etching is can be realized by dry etching with a mixed gas consisting of a fluoride gas, such as $CF_4$, $C_4F_8$, $CH_2F_2$, and CO, $O_2$, and Ar, as long as the interlayer insulating film $45_1$ exhibits etching resistance. In the case where the selective etching is carried out by wet etching, phosphoric acid, hydrofluoric acid, or ammonium fluoride can be used as an etchant.

Figure 15C:
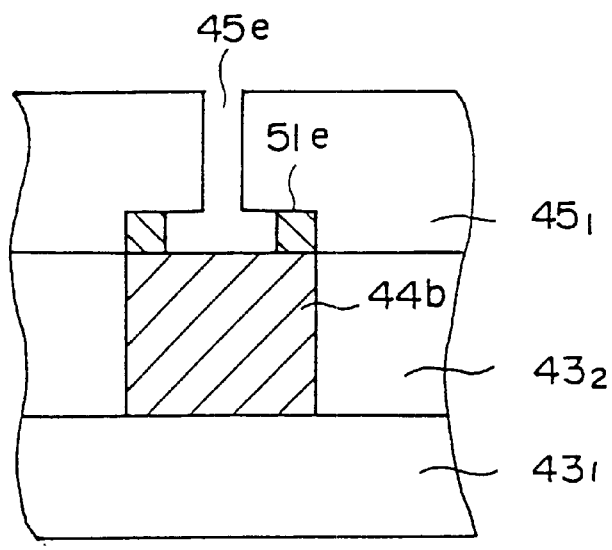
Figure 16A:
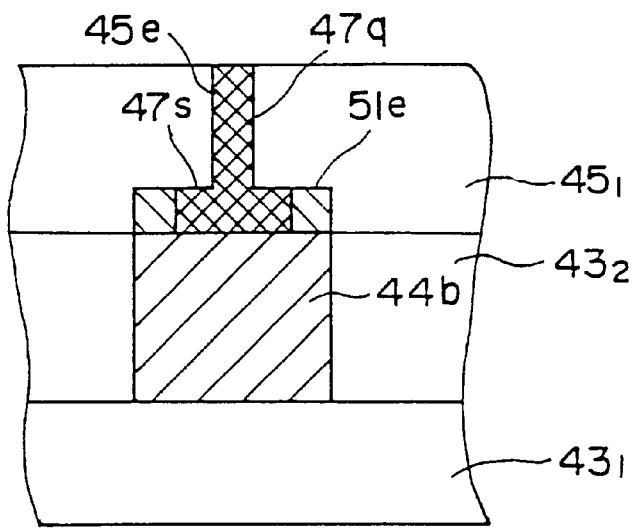
FIGS. 16A to 16C illustrate a second part of the contact structure in accordance with the second embodiment of the present invention.

In a step shown in FIG. 15C, the SiN pattern 51e partially remains on the contact pad 44b. The contact hole 45e is then entirely or partially filled with a conductive material such as Cu, thereby forming the conductive plug 47q having the enlarged base portion 47s as shown in FIG. 16A.

Figure 16B:
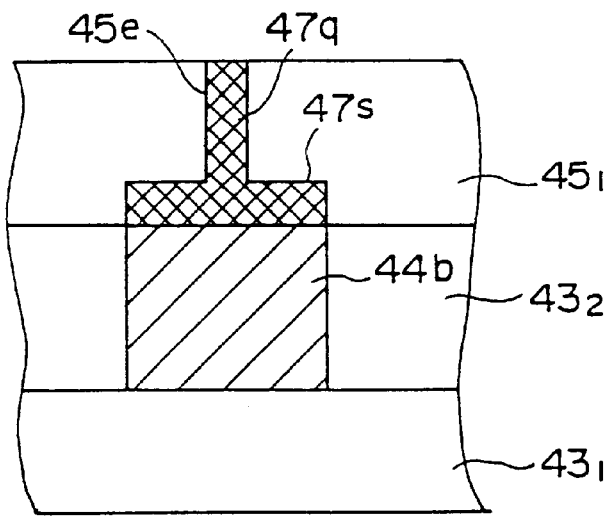
Figure 16C:
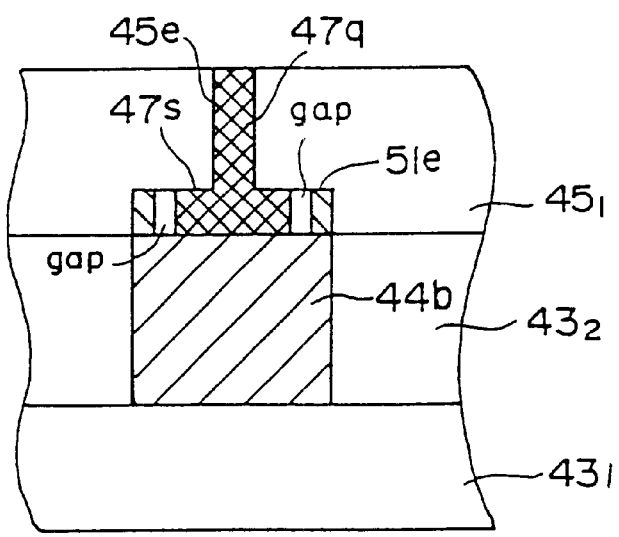

If the SiN pattern 51e is completely removed in the step shown in FIG. 15C, the conductive plug 47q shown in FIG. 16B can be obtained. If the SiN pattern 51e is almost entirely removed in the step shown in FIG. 15C, a gap might appear between the enlarged base portion 47s and the remaining part of the SiN pattern 51e, as shown in FIG. 16C. Even to such a case, the present invention can be applied.

This embodiment can also be applied to the other contact structures shown in FIG. 3, such as the conductive plugs 44p, 44q, 47p, and 49p.

As described above, in the semiconductor device 40 shown in FIG. 3, each of the conductive plugs has an enlarged base portion so as to increase the contact area with each adjacent lower wiring pattern. The larger contact area reduces the contact resistance. Thus, signal delay can be prevented in the multilayer interconnection structure of the present invention.

Furthermore, since each of the conductive plugs has an enlarged base portion in the semiconductor device 40, even if the position of the contact hole 45e deviates from the wiring pattern 44b directly below the contact hole 45e as shown in FIGS. 17A to 17D, the enlarged base portion 47s secures a large enough contact area between the conductive plug 47q and the wiring pattern 44b. This is very beneficial to a semiconductor device having a minute structure in which contact holes can easily deviate from the predetermined locations.

This advantageous aspect of the present invention shown in FIGS. 17A to 17D can be applied to the other contact structures in FIG. 3, such as the conductive plugs 44p, 44q, 47p, and 49p.

[Third Embodiment]

Figure 18A:
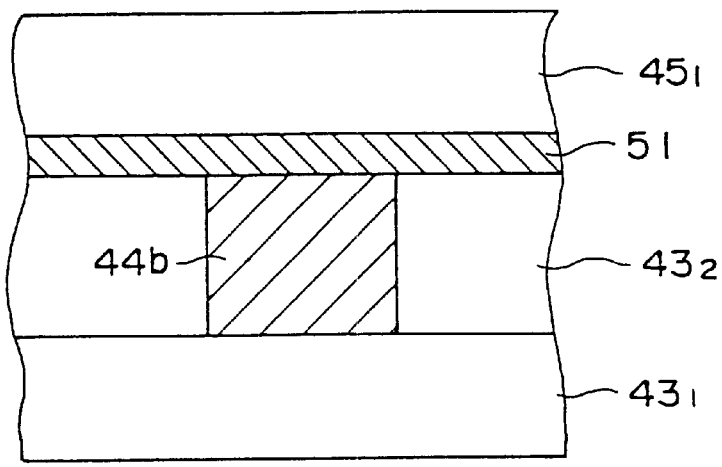
FIGS. 18A to 18C illustrate a first part of the formation process of a contact structure in accordance with a third embodiment of the present invention.
Figure 18B:
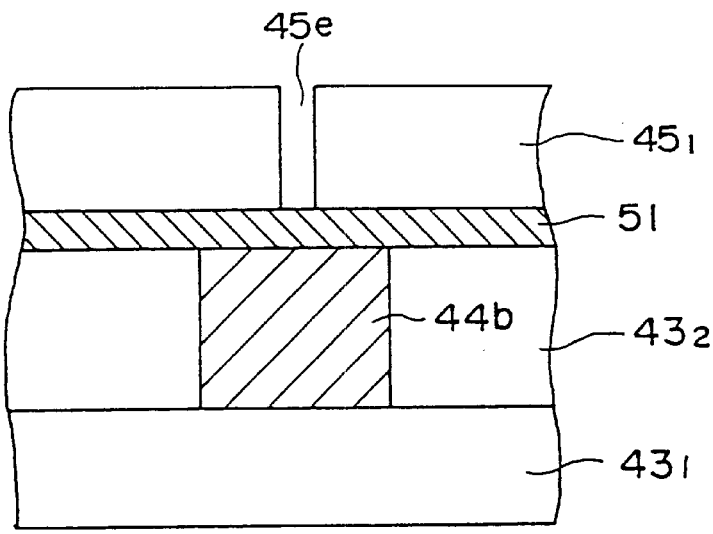
Figure 18C:
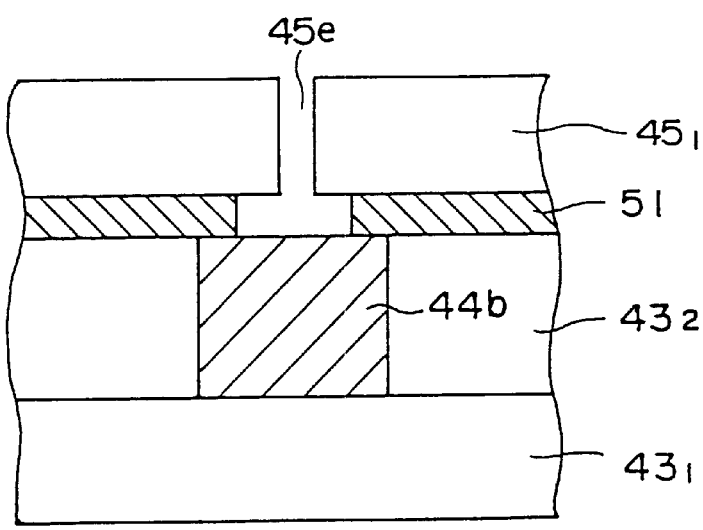
Figure 19:
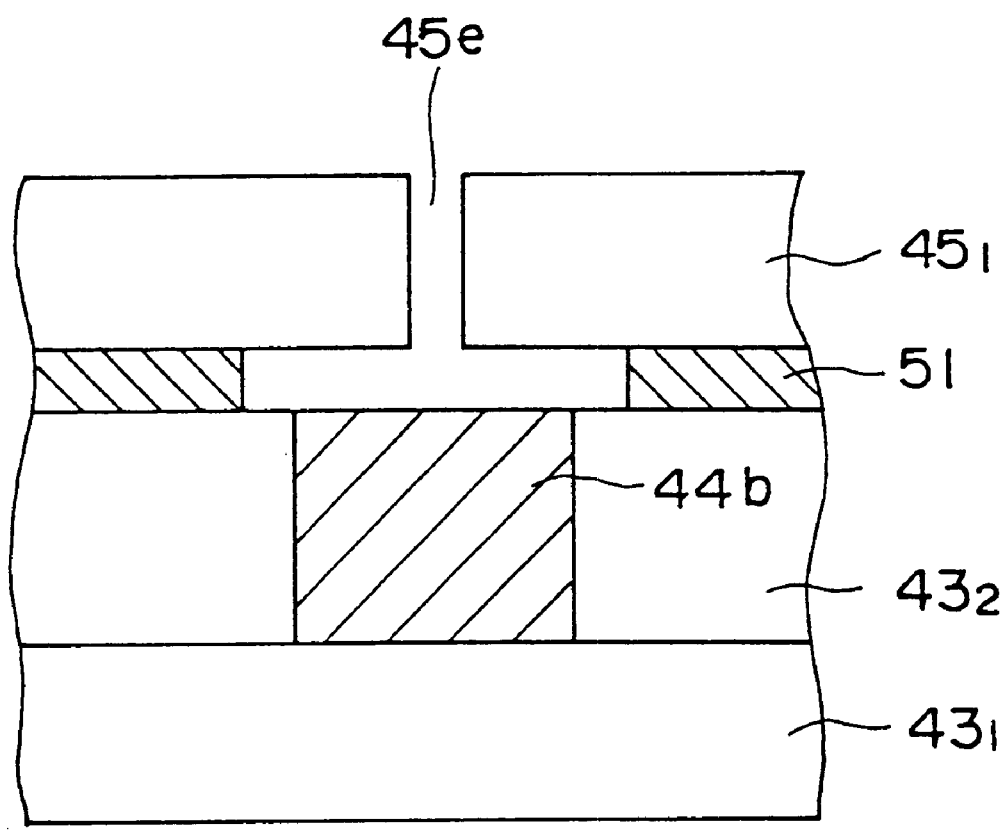
FIG. 19 illustrates a second part of the formation process of the contact structure in accordance with the third embodiment of the present invention.

Referring now to FIGS. 18A to 19, a third embodiment of the present invention will be described below by way of the example of the enlarged base portion 47s of the conductive plug 47q in the semiconductor device 40. In FIGS. 18A to 19, the same components as in the foregoing drawings are denoted by the same reference numerals. Also, the conductive plug 44q extending downward from the contact pad 44b is omitted in the figures, as in the second embodiment.

As shown in FIG. 18A, the interlayer insulating film comprises a first and second interlayer insulating films $43_2$ and $45_1$ that are inorganic insulating films made of PSG, BPSG, or $SiO_2$, or organic insulating films such as organic SOG. An SiN film 51 is interposed between the first and second interlayer insulating films $43_2$ and $45_1$. The contact pad 44b is formed in the first interlayer insulating film $45_2$, and the upper surface of the contact pad 44b is covered with the SiN film 51. The SiN film 51 extends in parallel with the principal plane of the Si substrate 41.

In a step shown in FIG. 18B corresponding to the step shown in FIG. 9A, the contact hole 45e is formed in the second interlayer insulating film $45_1$. In the step shown in FIG. 18C corresponding to the step shown in FIG. 9B, the SiN film 51 is removed by etching through the contact hole 45e. Since the first and second interlayer insulating films $43_2$ and $45_1$ are formed by inorganic insulating films made of PSG, BPSG, or $SiO_2$, or organic insulating films made of organic SOG or the like, which have a different etching rate from the SiN, only the SiN film 51 is selectively removed by etching. As a result, an enlarged base portions is formed at the lower end of the contact hole 45e. As described before, the selective removal can be carried out by dry etching with a mixed gas consisting of a fluoride gas, such as $CF_4$, $C_4F_8$, or $CH_2F_2$, CO, $O_2$, and Ar, as long as the interlayer insulating film $45_1$ exhibits etching resistance. In the case where the selective removal is carried out by wet etching, phosphoric acid, hydrofluoric acid, or ammonium fluoride can be used as an etchant.

The contact hole 45e having the enlarged base portion is entirely or partially filled with a conductive material, thereby forming a conductive plug having the same enlarged base portion as the conductive plug 47q shown in FIG. 16A.

FIG. 19 illustrates a case where the etching step shown in FIG. 18C is performed for a longer period of time. In this case, the enlarged base portion of the contact hole 45e transversely extends beyond the contact pad 44b.

As described above, in the contact structure of this embodiment, each of the conductive plugs has an enlarged base portion so as to increase the contact area with each adjacent lower wiring pattern. The larger contact area reduces the contact resistance. Thus, signal delay can be prevented in the multilayer interconnection structure of the present invention.

Figure 20A:
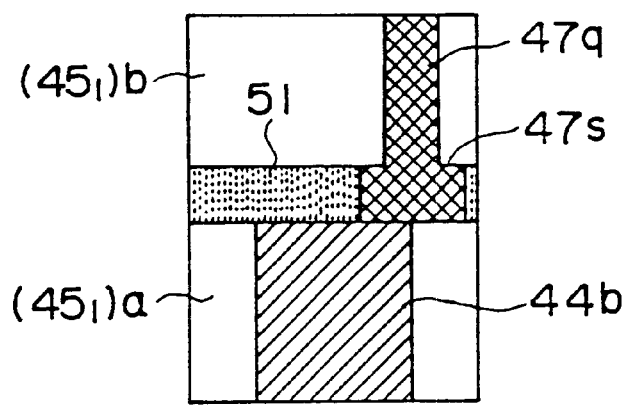
FIGS. 20A to 20C illustrate the advantages of the contact structure in accordance with the third embodiment of the present invention.
Figure 20B:
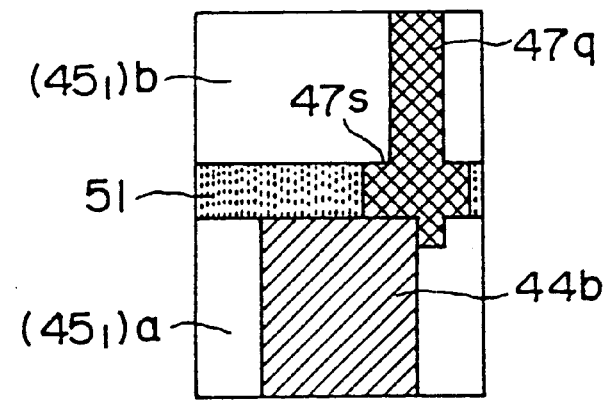
Figure 20C:
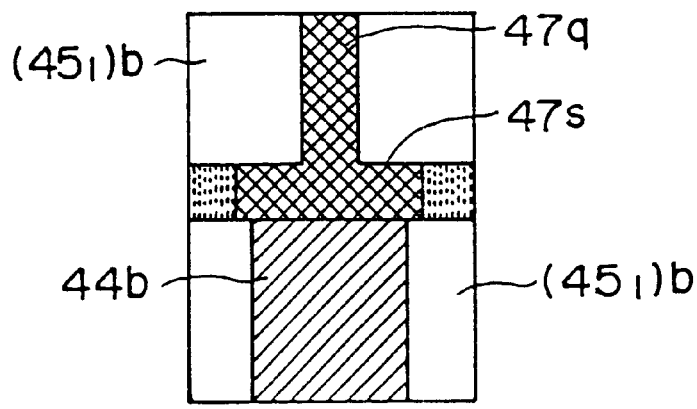

Furthermore, since each of the conductive plugs has an enlarged base portion in the contact structure of this embodiment, even if the contact hole 45e deviates from the wiring pattern 44b directly below the contact hole 45e as shown in FIGS. 20A to 20C, the enlarged base portion 47s secures a large enough contact area between the conductive plug 47q and the wiring pattern 44b. This is very beneficial to a semiconductor device having a minute structure in which contact holes can easily deviate from the predetermined locations.

This advantageous aspect of the present invention shown in FIGS. 20A to 20C can also be applied to the other contact structures in FIG. 3, such as the conductive plugs 44p, 44q, 47p, and 49p.

[Fourth Embodiment]

Figure 21A:
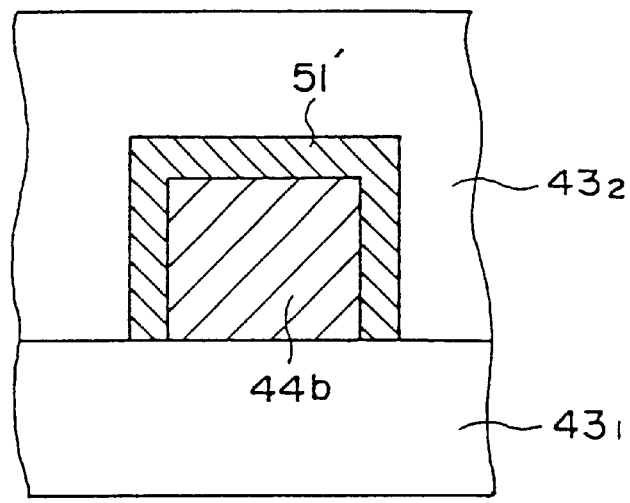
FIGS. 21A to 21C illustrate a first part of a contact structure in accordance with a fourth embodiment of the present invention.
Figure 21B:
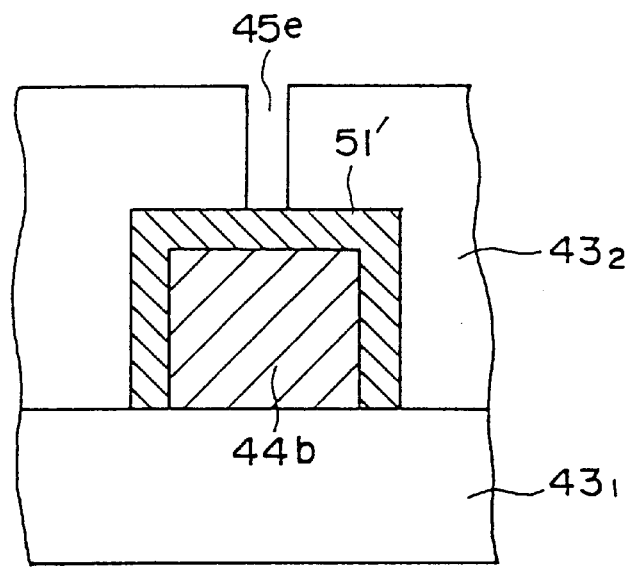
Figure 21C:
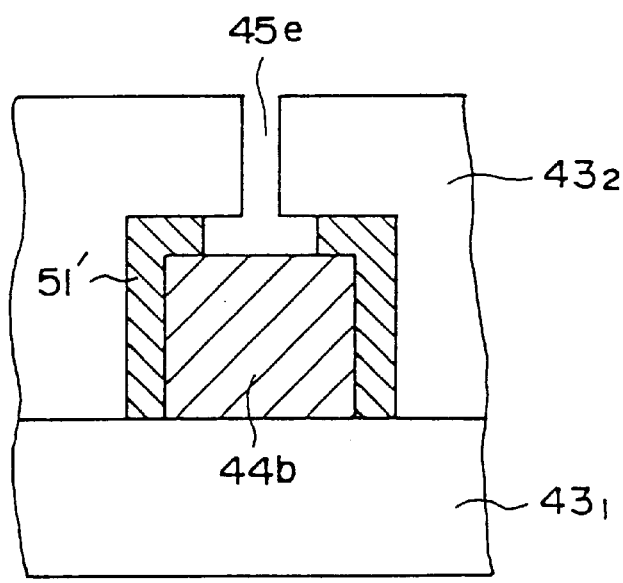
Figure 22:
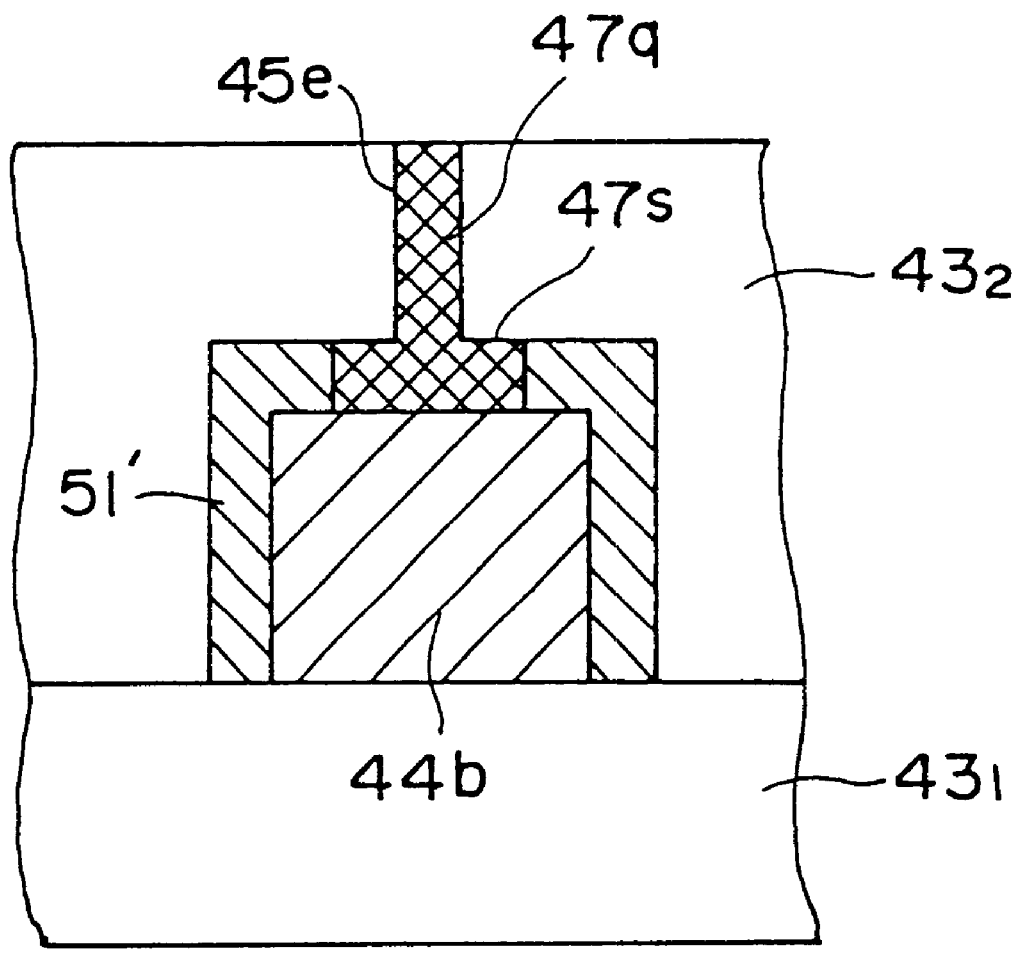
FIG. 22 illustrates a second part of the contact structure in accordance with the fourth embodiment of the present invention.

FIGS. 21A to 22 illustrate a contact structure and a method of forming the contact structure in accordance with a fourth embodiment of the present invention. In FIGS. 21A to 22, the same components as in the foregoing drawings are denoted by the same reference numerals. Also, the conductive plug 44q extending downward from the contact pad 44b is not omitted in the figures, as in the foregoing embodiments.

As shown in FIG. 21A, the upper surface and both sidewall surfaces of the contact pad 44b are covered with a SiN film 51'. In a step shown in FIG. 21B, the contact hole 45e is formed in the interlayer insulating film $45_1$ so as to expose a part of the SiN film 51' that covers the upper surface of the contact pad 44b.

In a step shown in FIG. 21C, the SiN film 51' is removed by etching through the contact hole 45e. Since the interlayer insulating films $45_1$ is formed by an inorganic insulating film made of PSG, BPSG, or $SiO_2$, or an organic insulating film made of organic SOG or the like, which has a different etching rate from the SiN, only the SiN film 51' is selectively removed by etching. As a result, an enlarged base portions is formed at the lower end of the contact hole 45e. As described before, the selective removal can be carried out by dry etching with a mixed gas consisting of a fluoride gas, such as $CF_4$, $C_4F_8$, or $CH_2F_2$, CO, $O_2$, and Ar, as long as the interlayer insulating film $45_1$ exhibits etching resistance. In the case where the selective removal is carried out by wet etching, phosphoric acid, hydrofluoric acid, or ammonium fluoride can be used as an etchant.

In a step shown in FIG. 22, the contact hole 45e is entirely or partially filled with a conductive material so as to obtain a desired contact structure including the conductive plug 47q having the enlarged base portion 47s.

Figure 23A:
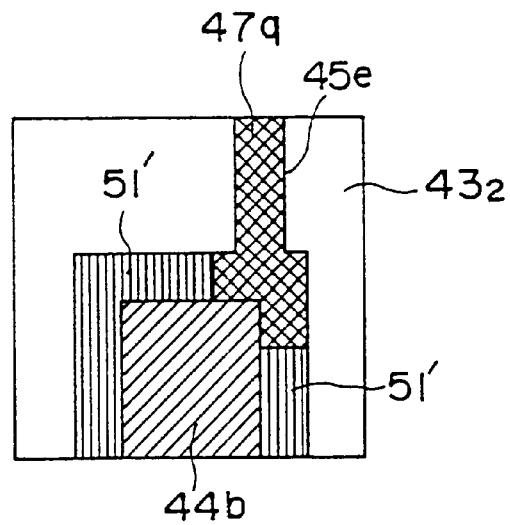
FIGS. 23A to 23C illustrate the advantages of the contact structure in accordance with the fourth embodiment of the present invention.
Figure 23B:
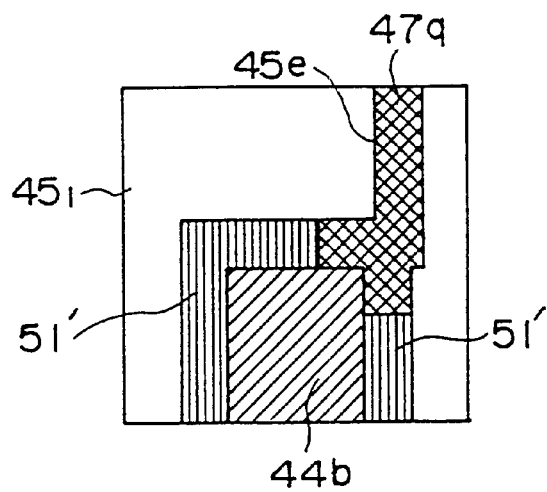
Figure 23C:
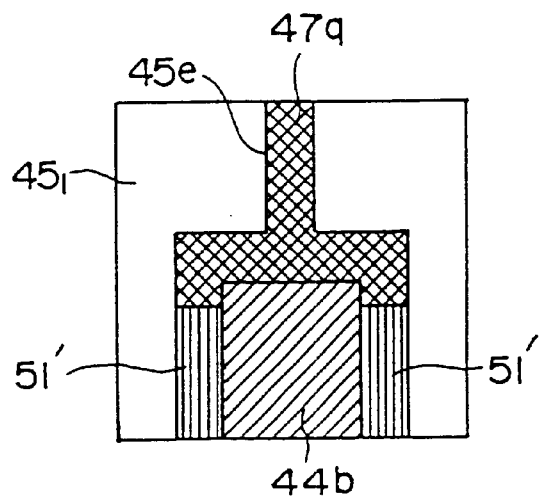

Since the conductive plug 47q has the enlarged base portion 47s in the contact structure of this embodiment, even if the contact hole 45e deviates from the wiring pattern 44b directly below the contact hole 45e as shown in FIGS. 23A to 23C, the enlarged base portion 47s secures a large enough contact area between the conductive plug 47q and the wiring pattern 44b. This is very beneficial to a semiconductor device having a minute structure in which contact holes can easily deviate from the predetermined locations.

Especially in this embodiment, the sidewall surfaces as well as the upper surface of the wiring pattern 44b are covered with the SiN film 51'. Accordingly, the enlarged base portion 47s of the conductive plug 47q ensures the contact with the wiring pattern 44b even if the contact hole 45e deviates from the wiring pattern 44b.

This advantageous aspect shown in FIGS. 23A to 23C can also be applied to the other contact structures shown in FIG. 3, such as the conductive plugs 47p and 49p.

[Fifth Embodiment]

Figure 24A:
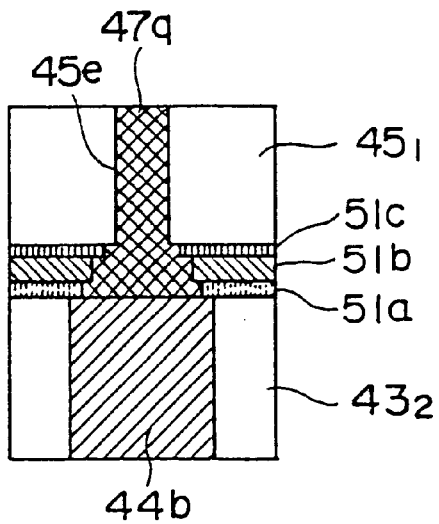
FIGS. 24A to 24C illustrate a contact structure in accordance with a fifth embodiment of the present invention.
Figure 24B:
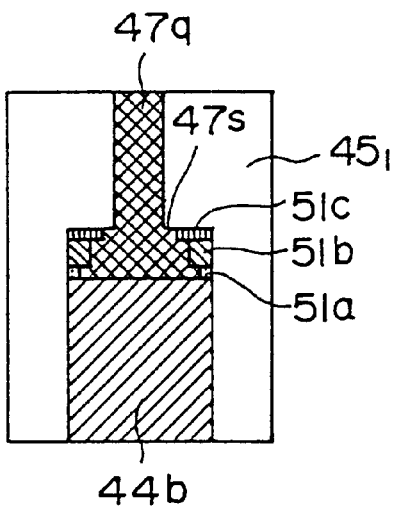
Figure 24C:
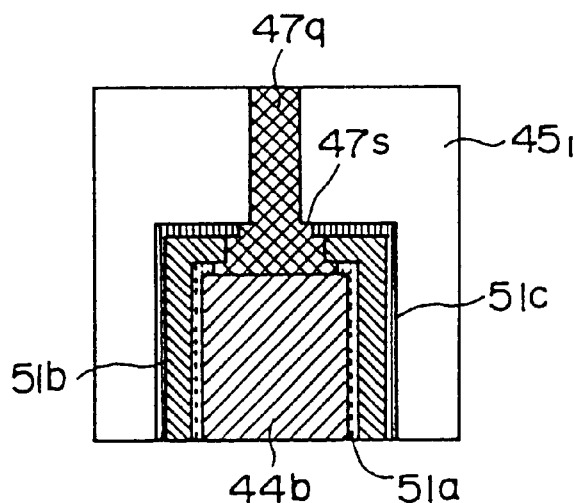

FIGS. 24A to 24C illustrate a contact structure in a multilayer interconnection structure in accordance with a fifth embodiment of the present invention. In FIGS. 24A to 24C, the same components as in the foregoing drawings are denoted by the same reference numerals. This embodiment will be described again by way of the example of the contact structure containing the conductive plug 47q in contact with the contact pad 44b. However, the contact structure of this embodiment can also be applied to the other contact structures shown in FIG. 3, such as the conductive plugs 44p, 44q, 47p, and 49p.

As shown in FIG. 24A, the contact structure of this embodiment is a modification of the contact structure of the third embodiment shown in FIGS. 18A to 19. The SiN film 51 is a stacked structure comprising three insulating films 51a to 51c having different etching rates. In this embodiment, the lowermost insulating film 51a has the highest etching rate, and the uppermost insulating film 51c has the lowest etching rate.

As a result, the enlarged base portion of the contact hole 45e has a shape that expands stepwise toward the bottom. Accordingly, the enlarged base portion 47s at the lower end of the conductive plug 47q also has a shape that expands stepwise toward the bottom. This enlarged base portion 47s ensures the contact between the conductive plug 47q and the contact pad 44b.

FIGS. 24B and 24C illustrate the contact structure of this embodiment applied to the second embodiment shown in FIGS. 15A to 16C, and to the fourth embodiment shown in FIGS. 21A to 22, respectively. In either case, the enlarged base portion 47s having the stepwise shape ensures the contact between the conductive plug 47q and the contact pad 44b.

[Sixth Embodiment]

In the above embodiments, each wiring pattern has a greater width or a greater diameter than each corresponding conductive plug formed thereon. However, the present invention is not limited to such a configuration, and can be applied to a case where the width of a wiring pattern is smaller than the diameter of the conductive plug formed thereon.

Figure 25A:
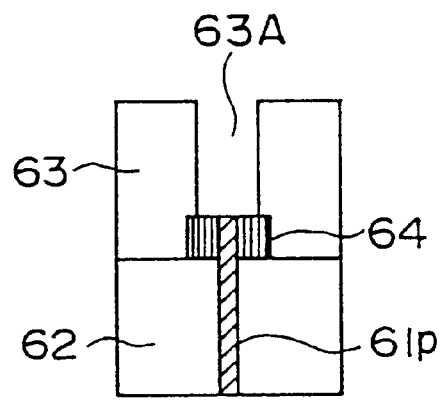
FIGS. 25A to 25C illustrate the formation process of a contact structure in accordance with a sixth embodiment of the present invention.
Figure 25B:
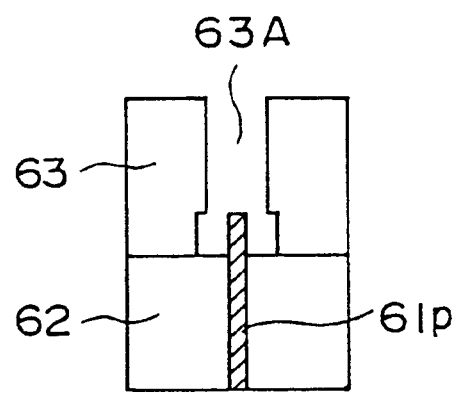
Figure 25C:
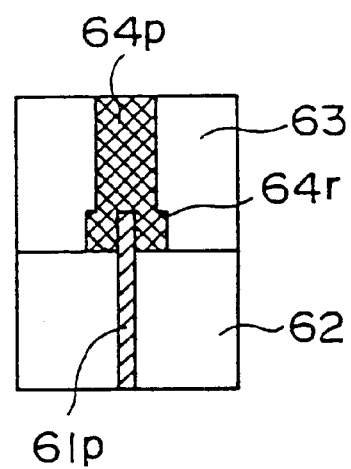

FIGS. 25A to 25C illustrate a contact structure in a multilayer interconnection structure and a method of producing that contact structure in accordance with a sixth embodiment of the present invention.

As shown in FIG. 25A, a thin conductive plug 61p made of W or Cu extends through an interlayer insulating film 62 formed by an inorganic insulating film made of PSG, BPSG, or $SiO_2$, or an organic insulating film such as organic SOG. The top end of the conductive plug 61p protrudes upward from the upper surface of the interlayer insulating film 62. A dielectric pattern 64 made of SiN or the like is formed on the interlayer insulating film 62 so as to cover the protruding portion of the conductive plug 61p.

The dielectric pattern 64 is covered with an interlayer insulating film 63 formed by an inorganic insulating film such as PSG, BPSG, or $Sio_2$, or an organic insulating film such as organic SOG. In the interlayer insulating film 63, a contact hole 63A is formed to expose the dielectric pattern 64. Here, the dielectric pattern 64 has a size larger than the diameter of the contact hole 63A.

In a step shown in FIG. 25B, the dielectric pattern 64 is removed by etching through the contact hole 63A. As a result, an enlarged base portion is formed at the lower end of the contact hole 63A, and the protruding portion of the conductive plug 61p is exposed through the enlarged base portion.

In a step shown in FIG. 25C, the contact hole 63A having the enlarged portion is entirely or partially filled with a conductive material such as Al, W, or Cu, thereby forming another conductive plug 64p to be electrically in contact with the conductive plug 61p. This conductive plug 64p is shaped according to the shape of the contact hole 63A, having an enlarged base portion 64r at its lower end.

In this embodiment, the conductive plug 64p may be a wiring pattern extending on the interlayer insulating film 62. Alternatively, the conductive plug 61p may be a wiring pattern extending through the interlayer insulating film 62.

Figure 26A:
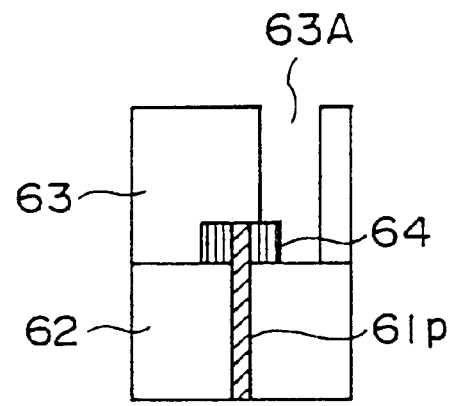
FIGS. 26A to 26C illustrate the advantages of the contact structure in accordance with the sixth embodiment of the present invention.
Figure 26B:
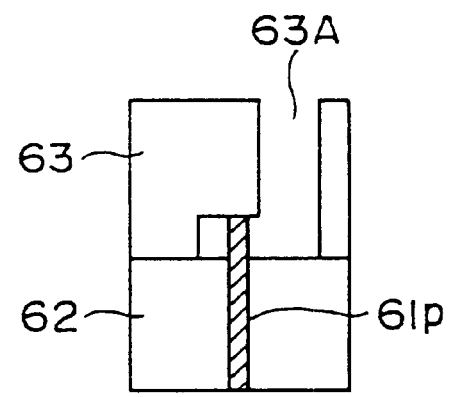
Figure 26C:
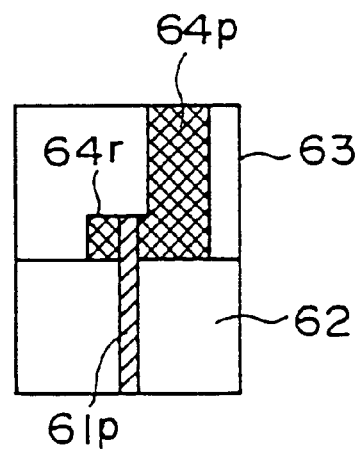

FIG. 26A illustrates a case where the contact hole 63A deviates from the conductive plug 61p in the contact structure shown in FIGS. 25A to 25C. In this case, the dielectric pattern 64 is still partially exposed through the contact hole 63A. When the dielectric pattern 64 is etched, the lower end of the contact hole 63A protrudes as shown in FIG. 26B. The contact hole 63A is then filled with a conductive material as shown in FIG. 26C. Thus, highly reliable contact can be secured between the conductive plugs 61p and 64p.

[Seventh Embodiment]

Figure 27A:
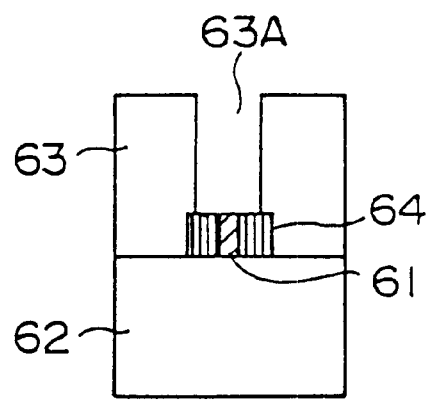
FIGS. 27A to 27C illustrate the formation process of a contact structure in accordance with a seventh embodiment of the present invention.
Figure 27B:
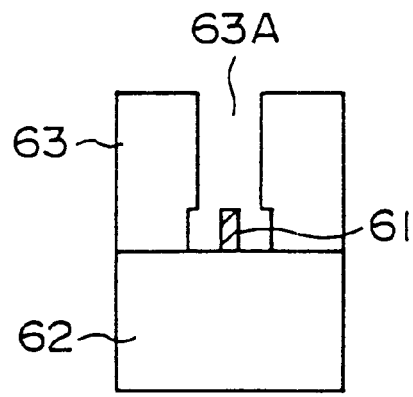
Figure 27C:
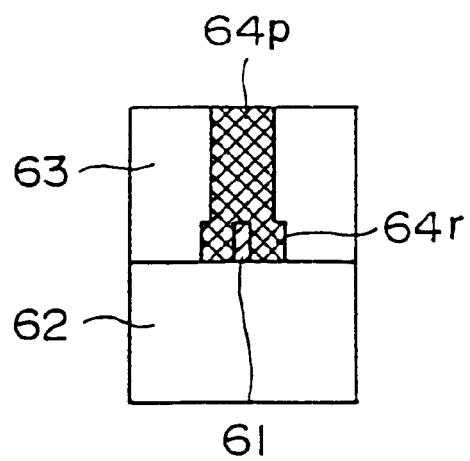

FIGS. 27A to 27C illustrate a contact structure in a multilayer interconnection structure and a method of producing that contact structure in accordance with a seventh embodiment of the present invention. In FIGS. 27A to 27C, the same components as in the foregoing drawings are denoted by the same reference numerals.

As shown in FIG. 27A, a narrow wiring pattern 61 extends on the interlayer insulating film 62, and is covered with the dielectric pattern 64 formed on the interlayer insulating film 62. The wiring pattern 61, together with the dielectric pattern 64, is further covered with the interlayer insulating film 63 formed on the interlayer insulating film 62. In the interlayer insulating film 63, the contact hole 63A is formed to expose the dielectric pattern 64. Here, the dielectric pattern 64 has a size larger than the diameter of the contact hole 63A.

In a step shown in FIG. 27B, the dielectric pattern 64 is removed by etching through the contact hole 63A, thereby forming an enlarged base portion at the lower end of the contact hole 63A. As a result, the wiring pattern 61 is exposed through the enlarged base portion.

In a step shown in FIG. 27C, the contact hole 63A having the enlarged base portion is entirely or partially filled with a conductive material such as Al, W, or Cu, so as to form another conductive plug 64p to be electrically in contact with the wiring pattern 61. This conductive plug 64p is shaped according to the shape of the contact hole 63A, having the enlarged base portion 64r at the lower end.

Figure 28A:
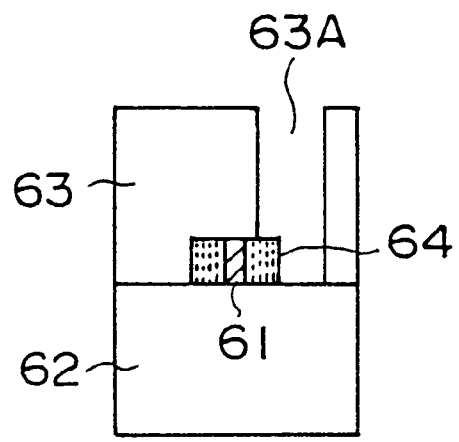
FIGS. 28A to 28C illustrate the advantages of the contact structure in accordance with the seventh embodiment of the present invention.
Figure 28B:
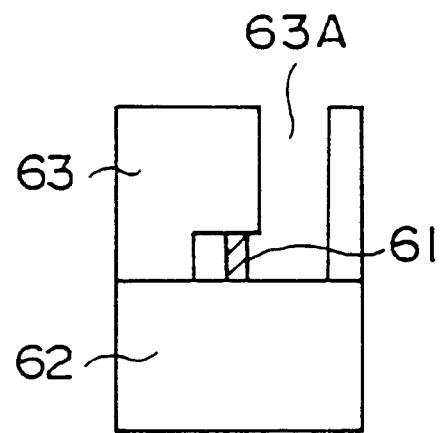
Figure 28C:
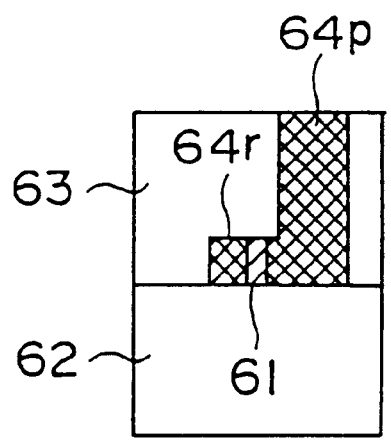

FIG. 28A illustrates a case where the contact hole 63A deviates from the conductive plug 61p in the contact structure shown in FIGS. 27A to 27C. In this case, the dielectric pattern 64 is still partially exposed through the contact hole 63A. When the dielectric pattern 64 is etched, a side portion of the contact hole 63A protrudes as shown in FIG. 28B. The contact hole 63A is then filled with a conductive material as shown in FIG. 28C. Thus, highly reliable contact can be secured between the wiring pattern 61 and the conductive plug 64p.

The present invention is not limited to the specifically disclosed embodiments, but variations and modifications may be made without departing from the scope of the present invention.

The present application is based on Japanese priority application No. 11-304631, filed on Oct. 26, 1999, the entire contents of which are hereby incorporated by reference.

What is claimed is:

1. A semiconductor device having a multilayer interconnection structure, comprising:

a first wiring pattern;

an insulating film formed on the first-layer wiring pattern;

a second wiring pattern formed on the insulating film; and a conductive plug that is formed in the insulating film and that connects the first wiring pattern and the second wiring pattern, the conductive plug comprising: a contact portion that contacts with a flat portion of the first wiring pattern; and a connecting portion that extends from the contact portion toward the second wiring pattern, the contact portion having a larger area than the connecting portion.

2. A semiconductor device having a multilayer interconnection structure, comprising:

a first wiring pattern;

an insulating film formed on the first-layer wiring pattern;

a second wiring pattern formed on the insulating film; and a conductive plug that is formed in the insulating film and that connects the first wiring pattern and the second wiring pattern, the conductive plug comprising: a contact portion that contacts with the first wiring pattern; and a connecting portion that extends from the contact portion toward the second wiring pattern, the contact portion having a larger area than the connecting portion, wherein the contact portion is outlined by a peripheral surface, and another film having a different etching rate from the insulating film is formed in contact with the peripheral surface.

3. The semiconductor device having a multilayer interconnection structure, comprising:

a first wiring pattern;

an insulating film formed on the first-layer wiring pattern;

a second wiring pattern formed on the insulating film; and a conductive plug that is formed in the insulating film and that connects the first wiring pattern and the second wiring pattern, the conductive plug comprising: a contact portion that contacts with the first wiring pattern; and a connecting portion that extends from the contact portion toward the second wiring pattern, the contact portion having a larger area than the connecting portion, wherein the contact portion is outlined by a peripheral surface, and another film having a different etching rate from the insulating film is formed, with a gap being interposed between said another film and the peripheral surface.

4. The semiconductor device as claimed in claim 2, wherein said another film is formed on the first wiring pattern and shaped according to a shape of the first wiring pattern.

5. The semiconductor device as claimed in claim 2, wherein said another film is formed on the first wiring pattern and serves as a continuous insulating film having a principal plane substantially in parallel with a principal plane of the insulating film.

6. The semiconductor device as claimed in claim 2, wherein said another film is formed on the first wiring pattern and covers sidewall surfaces of the first wiring pattern.

7. The semiconductor device as claimed in claim 2, wherein the peripheral surface is defined by a plurality of steps, and said another film is made up of stacked insulating films corresponding to the plurality of steps.

8. The semiconductor device as claimed in claim 1, wherein the contact portion collectively covers an upper surface and sidewall surface of the first wiring pattern.

* * * * *